United States Patent
Jeong et al.

(10) Patent No.: US 7,941,735 B2
(45) Date of Patent: May 10, 2011

(54) TRANSMITTER AND SYSTEM FOR TRANSMITTING/RECEIVING DIGITAL BROADCASTING STREAM AND METHOD THEREOF

(75) Inventors: Hae-joo Jeong, Seoul (KR); Jung-pil Yu, Suwon-si (KR); Yong-sik Kwon, Seoul (KR); Eui-jun Park, Seoul (KR); Joon-soo Kim, Seoul (KR); Jong-hun Kim, Suwon-si (KR); Kum-ran Ji, Seoul (KR); Jin-hee Jeong, Anyang-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 264 days.

(21) Appl. No.: 12/261,449

(22) Filed: Oct. 30, 2008

(65) Prior Publication Data
US 2009/0052522 A1    Feb. 26, 2009

Related U.S. Application Data

(63) Continuation of application No. 11/416,245, filed on May 3, 2006.

(60) Provisional application No. 60/755,150, filed on Jan. 3, 2006.

(51) Int. Cl.
*H03M 13/03* (2006.01)

(52) U.S. Cl. .................................. 714/792; 375/301

(58) Field of Classification Search ............ 714/786, 714/792; 375/270, 321, 340, 487
See application file for complete search history.

(56) References Cited

U.S. PATENT DOCUMENTS

| | | | |
|---|---|---|---|
| 6,118,825 A | 9/2000 | Ikeda et al. | |
| 6,980,603 B2 | 12/2005 | Choi et al. | |
| 2001/0033611 A1* | 10/2001 | Grimwood et al. | 375/219 |
| 2001/0055342 A1* | 12/2001 | Fimoff | 375/240.26 |
| 2002/0091973 A1* | 7/2002 | Choi et al. | 714/48 |
| 2002/0126222 A1 | 9/2002 | Choi et al. | |
| 2002/0154709 A1 | 10/2002 | Choi et al. | |
| 2002/0191712 A1* | 12/2002 | Gaddam et al. | 375/301 |
| 2002/0194570 A1* | 12/2002 | Birru et al. | 714/792 |
| 2003/0079173 A1* | 4/2003 | Birru | 714/792 |
| 2004/0028076 A1 | 2/2004 | Strolle et al. | |
| 2004/0057535 A1* | 3/2004 | Strolle et al. | 375/340 |
| 2004/0101046 A1 | 5/2004 | Yang et al. | |
| 2004/0148642 A1 | 7/2004 | Park et al. | |
| 2005/0097428 A1 | 5/2005 | Chang et al. | |
| 2005/0111588 A1* | 5/2005 | Green | 375/324 |

FOREIGN PATENT DOCUMENTS

WO    2004/043073 A1    5/2004

OTHER PUBLICATIONS

International Search Report mailed on Apr. 6, 2007, in International Patent Application No. PCT/KR/2006/005874.

(Continued)

*Primary Examiner* — Sam Rizk

(74) *Attorney, Agent, or Firm* — Sughrue Mion, PLLC

(57) ABSTRACT

A digital broadcasting transmission system processes dual transport stream (TS) including multi turbo streams. The digital broadcasting transmission system includes a turbo processor to detect a turbo stream from a dual transport stream (TS) which includes a multiplexed normal stream and a turbo stream, encoding the detected turbo stream and stuffing the encoded turbo stream into the dual TS; and a transmitter to trellis-encode the processed dual TS, and to output the resultant stream, wherein the turbo processor encodes the turbo stream using a plurality of turbo processors. Accordingly, a plurality of turbo streams may be processed in parallel.

6 Claims, 36 Drawing Sheets

OTHER PUBLICATIONS

Written Opinion of the International Searching Authority mailed on Apr. 6, 2007, in International Patent Application No. PCT/KR/2006/005874.

U.S. Appl. No. 11/416,245, filed May 3, 2006, Hae-joo Jeong et al., Samsung Electronics Co., Ltd.

U.S. Appl. No. 12/261,462, filed Oct. 30, 2008, Hae-joo Jeong et al., Samsung Electronics Co., Ltd.

U.S. Appl. No. 12/261,438, filed Oct. 30, 2008, Hae-joo Jeong et al., Samsung Electronics Co., Ltd.

* cited by examiner

Interleaving Rule = {2,1,3,0}

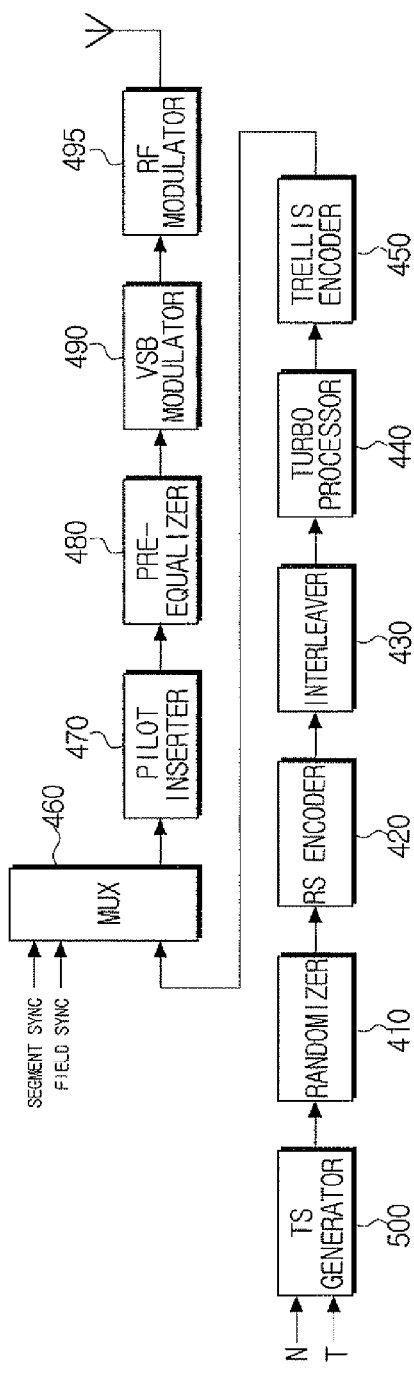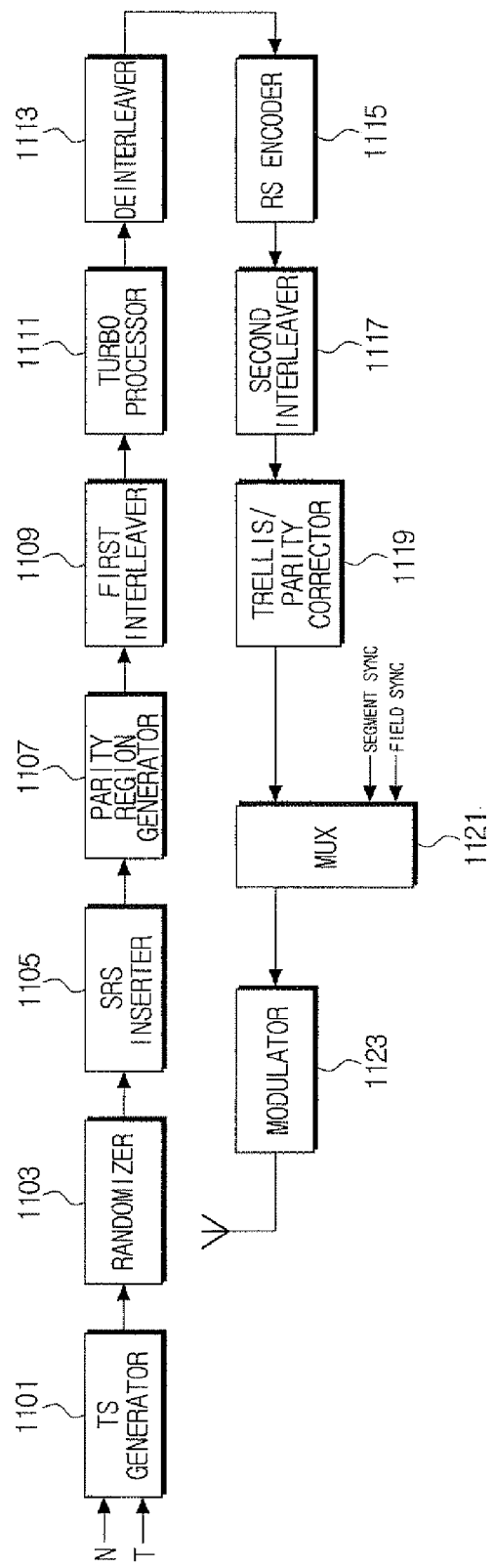

FIG. 16B

| SYNC | PID | Turbo Data |
|------|-----|------------|
| SYNC | PID | Normal Data |
| SYNC | PID | Normal Data |
| SYNC | PID | Normal Data |

| SYNC | PID | Turbo Data |
|------|-----|------------|
| SYNC | PID | Turbo Data |
| SYNC | PID | Normal Data |
| SYNC | PID | Normal Data |

| SYNC | PID | Turbo Data | | |
|------|-----|-----------|---|---|
| SYNC | PID | AF Header | Turbo Data | Normal Data |
| SYNC | PID | Normal Data | | |
| SYNC | PID | Normal Data | | |

| | 3 bytes | 2 bytes | 128 bytes | 182-128 bytes |
|---|---|---|---|---|
| 1 | PID | AF Header | Turbo data | Normal data |
| 2 | PID | | Normal data | |
| 3 | PID | | Normal data | |
| 4 | PID | | Normal data | |
| 5 | PID | AF Header | Turbo data | Normal data |
| 6 | PID | | Normal data | |
| 7 | PID | | Normal data | |
| 8 | PID | | Normal data | |
| 9 | PID | AF Header | Turbo data | Normal data |
| 10 | PID | | Normal data | |
| 11 | PID | | Normal data | |
| 12 | PID | | Normal data | |
| 13 | PID | AF Header | Turbo data | Normal data |
| 14 | PID | | Normal data | |
| 15 | PID | AF Header | reserved for PCR(6 bytes) | 171 bytes of Normal data |
| 16 | PID | | Normal data | |
| 17 | PID | AF Header | Turbo data | Normal data |
| 18 | PID | | Normal data | |
| 19 | PID | | Normal data | |
| 20 | PID | | Normal data | |
| 21 | PID | AF Header | Turbo data | Normal data |
| 22 | PID | | Normal data | |
| 23 | PID | | Normal data | |
| 24 | PID | | Normal data | |
| 25 | PID | AF Header | Turbo data | Normal data |
| 26 | PID | | Normal data | |
| 27 | PID | | Normal data | |
| 28 | PID | | Normal data | |
| 29 | PID | AF Header | Turbo data | Normal data |
| 30 | PID | | Normal data | |
| 31 | PID | | Normal data | |
| 32 | PID | | Normal data | |
| 33 | PID | AF Header | Turbo data | Normal data |
| 34 | PID | | Normal data | |
| 35 | PID | | Normal data | |
| 36 | PID | | Normal data | |
| 37 | PID | AF Header | Turbo data | Normal data |
| 38 | PID | | Normal data | |
| 39 | PID | | Normal data | |
| 40 | PID | | Normal data | |
| 41 | PID | AF Header | Turbo data | Normal data |
| 42 | PID | | Normal data | |
| 43 | PID | | Normal data | |
| 44 | PID | | Normal data | |
| 45 | PID | AF Header | Turbo data | Normal data |
| 46 | PID | | Normal data | |
| 47 | PID | | Normal data | |
| 48 | PID | | Normal data | |
| 49 | PID | AF Header | Turbo data | Normal data |
| 50 | PID | | Normal data | |
| 51 | PID | | Normal data | |
| 52 | PID | | Normal data | |

FIG. 21A

| A | SYNC | PID | Turbo Data |
|---|------|-----|------------|
|   | 1    | 3   | 184        |

| B | SYNC | PID | AF Header | Stuffing | Stuffing | Normal Data |
|---|------|-----|-----------|----------|----------|-------------|
|   | 1    | 3   | 2         | S        | N        | 182-S-N     |

| C | SYNC | PID | AF Header | SRS | Turbo Data | Normal Data |
|---|------|-----|-----------|-----|------------|-------------|
|   | 1    | 3   | 2         | S   | N          | 182-S-N     |

FIG. 21B

| SYNC | PID | AF Header | SRS | Turbo Data  |
|------|-----|-----------|-----|-------------|
| SYNC | PID | AF Header | SRS | Normal Data |
| SYNC | PID | AF Header | SRS | Normal Data |
| SYNC | PID | AF Header | SRS | Normal Data |
| 1    | 3   | 2         | S   | 182-S       |

FIG. 21C

| SYNC | PID | AF Header | SRS | Turbo Data |
|------|-----|-----------|-----|------------|
| SYNC | PID | AF Header | SRS | Turbo Data |
| SYNC | PID | AF Header | SRS | Normal Data |
| SYNC | PID | AF Header | SRS | Normal Data |

| SYNC | PID | AF Header | SRS | Turbo Data | |
|------|-----|-----------|-----|------------|---|
| SYNC | PID | AF Header | SRS | Turbo Data | Normal Data |
| SYNC | PID | AF Header | SRS | Normal Data | |
| SYNC | PID | AF Header | SRS | Normal Data | |

| | 3 bytes | 2 bytes | 1 | 1 | 1 | 1 | 1 | 1 | {4,14,21} | 128 bytes | 182-128 bytes |
|---|---|---|---|---|---|---|---|---|---|---|---|
| 1 | PID | AF Header | | | | | | | | SRS | Turbo Data | Normal Data |
| 2 | PID | AF Header | | | | | | | | SRS | Normal Data |
| 3 | PID | AF Header | | | | | | | | SRS | Normal Data |
| 4 | PID | AF Header | | | | | | | | SRS | Normal Data |
| 5 | PID | AF Header | | | | | | | | SRS | Turbo Data | Normal Data |
| 6 | PID | AF Header | | | | | | | | SRS | Normal Data |
| 7 | PID | AF Header | TDC | | | | | | | SRS | Normal Data |
| 8 | PID | AF Header | TDC | | | | | | | SRS | Normal Data |
| 9 | PID | AF Header | TDC | | | | | | | SRS | Turbo Data | Normal Data |
| 10 | PID | AF Header | TDC | | | | | | | SRS | Normal Data |
| 11 | PID | AF Header | | | | | | | | SRS | Normal Data |
| 12 | PID | AF Header | SRS | TDC | | | | | | SRS | Normal Data |
| 13 | PID | AF Header | SRS | TDC | TDC | | | | | SRS | Turbo Data | Normal Data |
| 14 | PID | AF Header | SRS | TDC | TDC | TDC | | | | SRS | Normal Data |
| 15 | PID | AF Header | reserved for PCR | | | | | | | SRS | Normal Data |
| 16 | PID | AF Header | | | | | | | | SRS | Normal Data |
| 17 | PID | AF Header | | | | | | | | SRS | Turbo Data | Normal Data |
| 18 | PID | AF Header | | | | | | | | SRS | Normal Data |
| 19 | PID | AF Header | TDC | | | | | | | SRS | Normal Data |
| 20 | PID | AF Header | TDC | | | | | | | SRS | Normal Data |
| 21 | PID | AF Header | TDC | | | | | | | SRS | Turbo Data | Normal Data |
| 22 | PID | AF Header | TDC | | | | | | | SRS | Normal Data |
| 23 | PID | AF Header | | | | | | | | SRS | Normal Data |
| 24 | PID | AF Header | SRS | TDC | | | | | | SRS | Normal Data |
| 25 | PID | AF Header | SRS | TDC | TDC | | | | | SRS | Turbo Data | Normal Data |
| 26 | PID | AF Header | SRS | TDC | TDC | TDC | | | | SRS | Normal Data |
| 27 | PID | AF Header | TDC | TDC | TDC | TDC | TDC | | | SRS | Normal Data |
| 28 | PID | AF Header | | | | | | | | SRS | Normal Data |
| 29 | PID | AF Header | | | | | | | | SRS | Turbo Data | Normal Data |
| 30 | PID | AF Header | | | | | | | | SRS | Normal Data |
| 31 | PID | AF Header | TDC | | | | | | | SRS | Normal Data |
| 32 | PID | AF Header | TDC | | | | | | | SRS | Normal Data |
| 33 | PID | AF Header | TDC | | | | | | | SRS | Turbo Data | Normal Data |
| 34 | PID | AF Header | TDC | | | | | | | SRS | Normal Data |
| 35 | PID | AF Header | | | | | | | | SRS | Normal Data |
| 36 | PID | AF Header | SRS | TDC | | | | | | SRS | Normal Data |
| 37 | PID | AF Header | SRS | TDC | TDC | | | | | SRS | Turbo Data | Normal Data |
| 38 | PID | AF Header | SRS | TDC | TDC | TDC | | | | SRS | Normal Data |
| 39 | PID | AF Header | TDC | TDC | TDC | TDC | TDC | | | SRS | Normal Data |
| 40 | PID | AF Header | | | | | | | | SRS | Normal Data |
| 41 | PID | AF Header | | | | | | | | SRS | Turbo Data | Normal Data |
| 42 | PID | AF Header | | | | | | | | SRS | Normal Data |
| 43 | PID | AF Header | TDC | | | | | | | SRS | Normal Data |
| 44 | PID | AF Header | TDC | | | | | | | SRS | Normal Data |
| 45 | PID | AF Header | TDC | | | | | | | SRS | Turbo Data | Normal Data |
| 46 | PID | AF Header | TDC | | | | | | | SRS | Normal Data |
| 47 | PID | AF Header | | | | | | | | SRS | Normal Data |
| 48 | PID | AF Header | SRS | TDC | | | | | | SRS | Normal Data |
| 49 | PID | AF Header | SRS | TDC | TDC | | | | | SRS | Turbo Data | Normal Data |
| 50 | PID | AF Header | SRS | TDC | TDC | TDC | | | | SRS | Normal Data |
| 51 | PID | AF Header | TDC | TDC | TDC | TDC | TDC | | | SRS | Normal Data |
| 52 | PID | AF Header | | | | | | | | SRS | Normal Data |

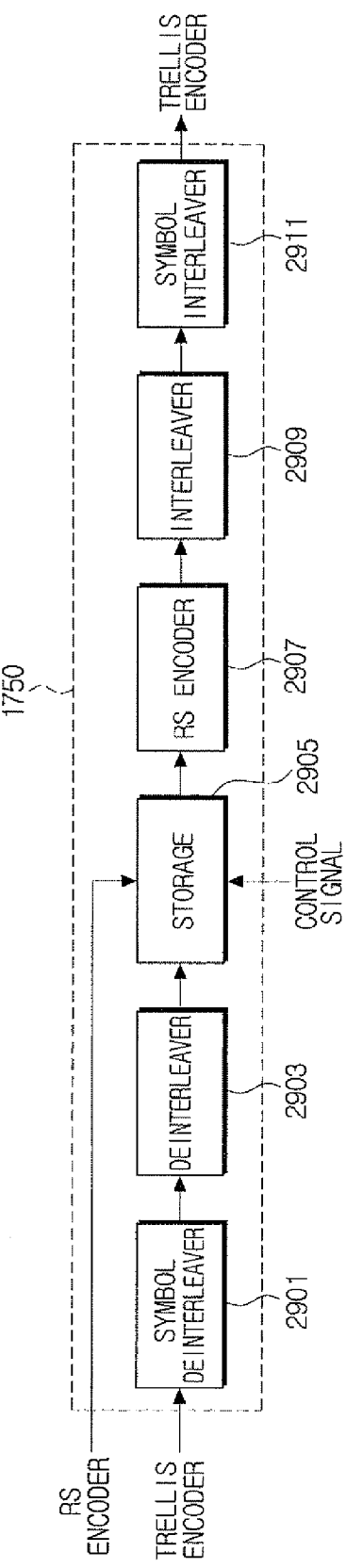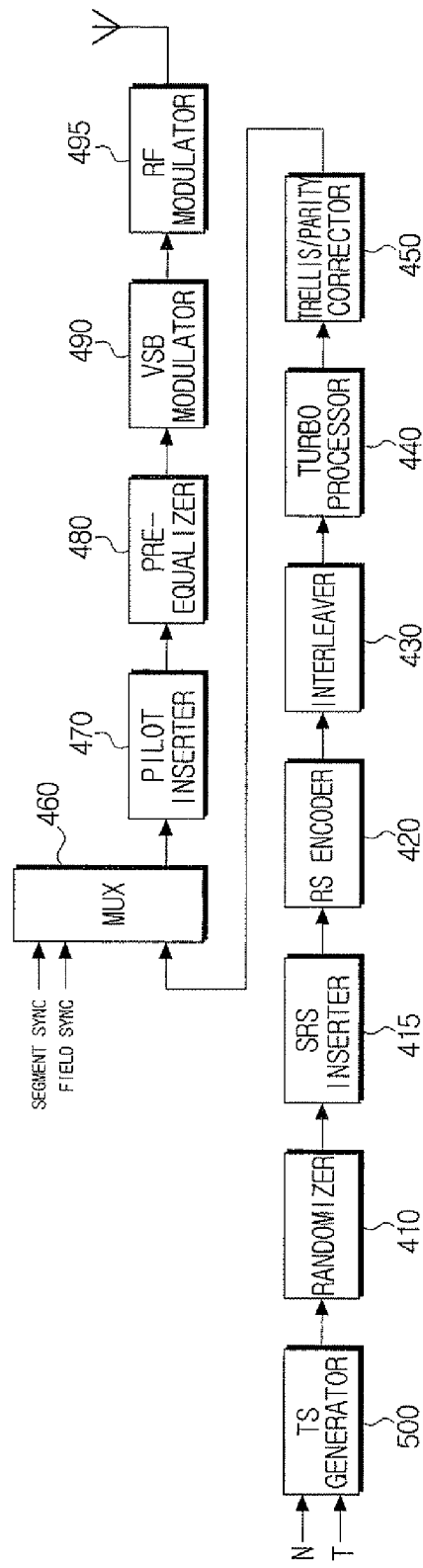

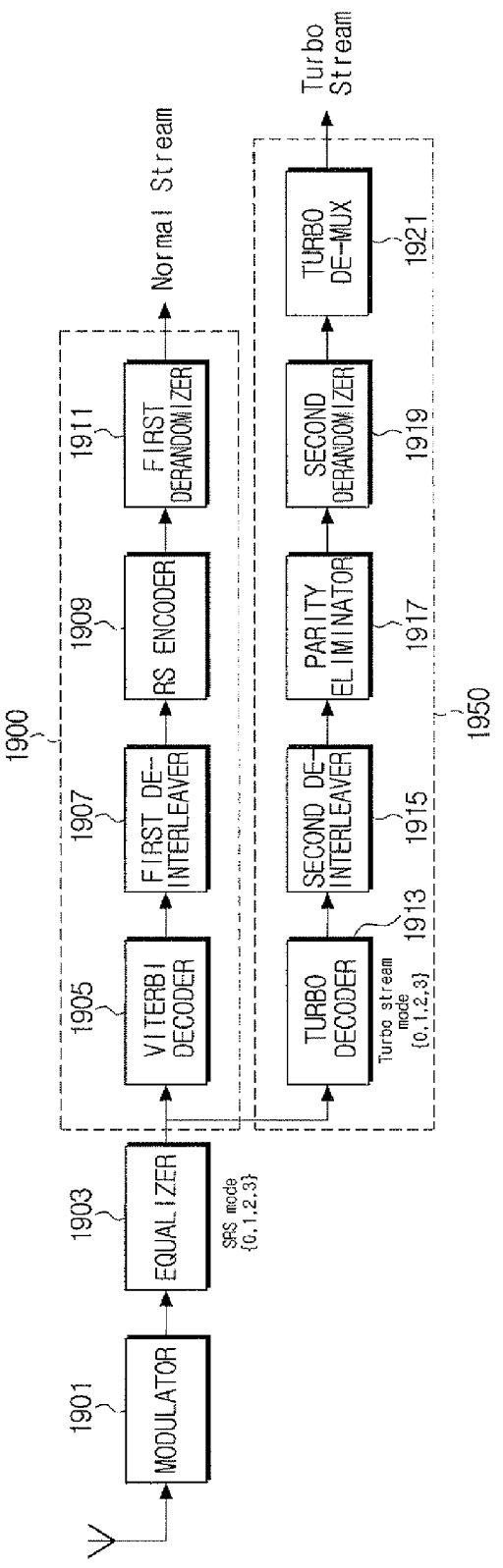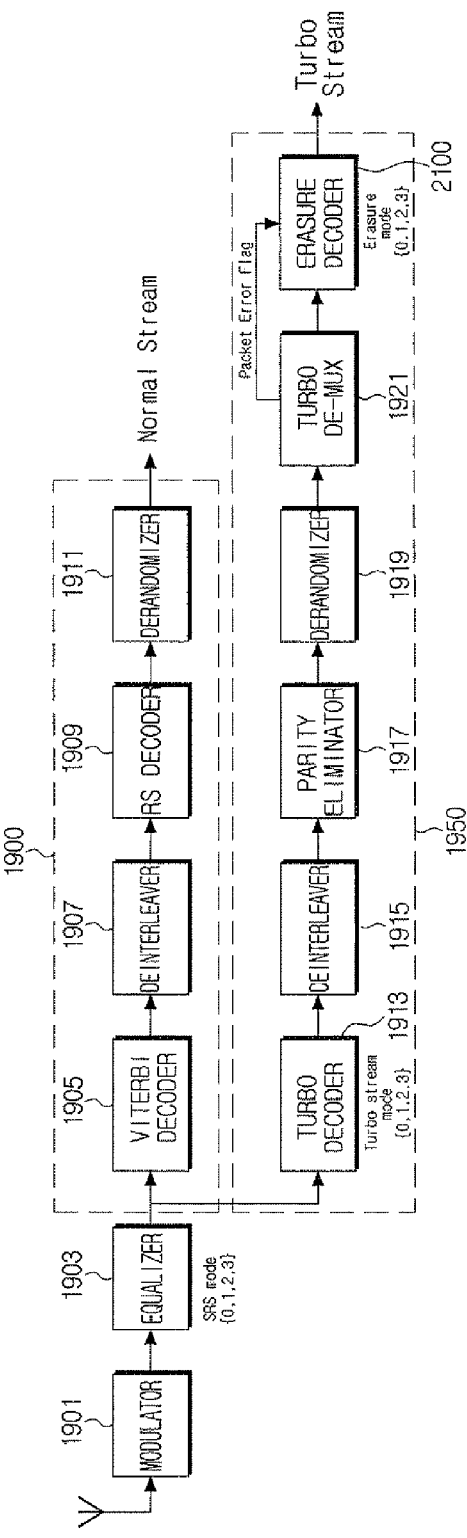

FIG. 40

| | 3 bytes | 2 bytes | 128 bytes | 182~128 bytes |
|---|---|---|---|---|
| 1 | Header | AF Head | 128 bytes of Turbo data 1 | 54bytes of Normal data |
| 2 | Header | AF Head | 128 bytes of Turbo data 2 | 54bytes of Normal data |
| 3 | Header | | 184 bytes of Normal data | |
| 4 | Header | | 184 bytes of Normal data | |
| 5 | Header | AF Head | 128 bytes of Turbo data 1 | 54bytes of Normal data |
| 6 | Header | AF Head | 128 bytes of Turbo data 2 | 54bytes of Normal data |
| 7 | Header | | 184 bytes of Normal data | |
| 8 | Header | | 184 bytes of Normal data | |
| 9 | Header | AF Head | 128 bytes of Turbo data 1 | 54bytes of Normal data |
| 10 | Header | AF Head | 128 bytes of Turbo data 2 | 54bytes of Normal data |
| 11 | Header | | 184 bytes of Normal data | |
| 12 | Header | | 184 bytes of Normal data | |
| 13 | Header | AF Head | 128 bytes of Turbo data 1 | 54bytes of Normal data |
| 14 | Header | AF Head | 128 bytes of Turbo data 2 | 54bytes of Normal data |
| 15 | Header | AF Head | reserved for PCR(6 bytes) | 171 bytes of Normal data |
| 16 | Header | | 184 bytes of Normal data | |
| 17 | Header | AF Head | 128 bytes of Turbo data 1 | 54bytes of Normal data |
| 18 | Header | AF Head | 128 bytes of Turbo data 2 | 54bytes of Normal data |
| 19 | Header | | 184 bytes of Normal data | |
| 20 | Header | | 184 bytes of Normal data | |
| 21 | Header | AF Head | 128 bytes of Turbo data 1 | 54bytes of Normal data |
| 22 | Header | AF Head | 128 bytes of Turbo data 2 | 54bytes of Normal data |
| 23 | Header | | 184 bytes of Normal data | |
| 24 | Header | | 184 bytes of Normal data | |
| 25 | Header | AF Head | 128 bytes of Turbo data 1 | 54bytes of Normal data |
| 26 | Header | AF Head | 128 bytes of Turbo data 2 | 54bytes of Normal data |
| 27 | Header | | 184 bytes of Normal data | |
| 28 | Header | | 184 bytes of Normal data | |
| 29 | Header | AF Head | 128 bytes of Turbo data 1 | 54bytes of Normal data |
| 30 | Header | AF Head | 128 bytes of Turbo data 2 | 54bytes of Normal data |
| 31 | Header | | 184 bytes of Normal data | |
| 32 | Header | | 184 bytes of Normal data | |
| 33 | Header | AF Head | 128 bytes of Turbo data 1 | 54bytes of Normal data |
| 34 | Header | AF Head | 128 bytes of Turbo data 2 | 54bytes of Normal data |
| 35 | Header | | 184 bytes of Normal data | |
| 36 | Header | | 184 bytes of Normal data | |
| 37 | Header | AF Head | 128 bytes of Turbo data 1 | 54bytes of Normal data |
| 38 | Header | AF Head | 128 bytes of Turbo data 2 | 54bytes of Normal data |
| 39 | Header | | 184 bytes of Normal data | |
| 40 | Header | | 184 bytes of Normal data | |
| 41 | Header | AF Head | 128 bytes of Turbo data 1 | 54bytes of Normal data |
| 42 | Header | AF Head | 128 bytes of Turbo data 2 | 54bytes of Normal data |
| 43 | Header | | 184 bytes of Normal data | |
| 44 | Header | | 184 bytes of Normal data | |
| 45 | Header | AF Head | 128 bytes of Turbo data 1 | 54bytes of Normal data |
| 46 | Header | AF Head | 128 bytes of Turbo data 2 | 54bytes of Normal data |
| 47 | Header | | 184 bytes of Normal data | |
| 48 | Header | | 184 bytes of Normal data | |
| 49 | Header | AF Head | 128 bytes of Turbo data 1 | 54bytes of Normal data |
| 50 | Header | AF Head | 128 bytes of Turbo data 2 | 54bytes of Normal data |
| 51 | Header | | 184 bytes of Normal data | |
| 52 | Header | | 184 bytes of Normal data | |

FIG. 41

| | 3 bytes | 2 bytes | 128 bytes | 182-128 bytes |
|---|---|---|---|---|
| 1 | Header | AF Head | 128 bytes of Turbo data 1 | 54bytes of Normal data |
| 2 | Header | AF Head | 128 bytes of Turbo data 2 | 54bytes of Normal data |
| 3 | Header | | 184 bytes of Normal data | |
| 4 | Header | AF Head | 128 bytes of Turbo data 3 | 54bytes of Normal data |
| 5 | Header | AF Head | 128 bytes of Turbo data 1 | 54bytes of Normal data |
| 6 | Header | AF Head | 128 bytes of Turbo data 2 | 54bytes of Normal data |
| 7 | Header | | 184 bytes of Normal data | |
| 8 | Header | AF Head | 128 bytes of Turbo data 3 | 54bytes of Normal data |
| 9 | Header | AF Head | 128 bytes of Turbo data 1 | 54bytes of Normal data |
| 10 | Header | AF Head | 128 bytes of Turbo data 2 | 54bytes of Normal data |
| 11 | Header | | 184 bytes of Normal data | |
| 12 | Header | AF Head | 128 bytes of Turbo data 3 | 54bytes of Normal data |
| 13 | Header | AF Head | 128 bytes of Turbo data 1 | 54bytes of Normal data |
| 14 | Header | AF Head | 128 bytes of Turbo data 2 | 54bytes of Normal data |
| 15 | Header | AF Head | reserved for PCR(6 bytes) | 171 bytes of Normal data |
| 16 | Header | AF Head | 128 bytes of Turbo data 3 | 54bytes of Normal data |
| 17 | Header | AF Head | 128 bytes of Turbo data 1 | 54bytes of Normal data |
| 18 | Header | AF Head | 128 bytes of Turbo data 2 | 54bytes of Normal data |
| 19 | Header | | 184 bytes of Normal data | |
| 20 | Header | AF Head | 128 bytes of Turbo data 3 | 54bytes of Normal data |
| 21 | Header | AF Head | 128 bytes of Turbo data 1 | 54bytes of Normal data |
| 22 | Header | AF Head | 128 bytes of Turbo data 2 | 54bytes of Normal data |
| 23 | Header | | 184 bytes of Normal data | |
| 24 | Header | AF Head | 128 bytes of Turbo data 3 | 54bytes of Normal data |
| 25 | Header | AF Head | 128 bytes of Turbo data 1 | 54bytes of Normal data |
| 26 | Header | AF Head | 128 bytes of Turbo data 2 | 54bytes of Normal data |
| 27 | Header | | 184 bytes of Normal data | |
| 28 | Header | AF Head | 128 bytes of Turbo data 3 | 54bytes of Normal data |
| 29 | Header | AF Head | 128 bytes of Turbo data 1 | 54bytes of Normal data |
| 30 | Header | AF Head | 128 bytes of Turbo data 2 | 54bytes of Normal data |
| 31 | Header | | 184 bytes of Normal data | |
| 32 | Header | AF Head | 128 bytes of Turbo data 3 | 54bytes of Normal data |
| 33 | Header | AF Head | 128 bytes of Turbo data 1 | 54bytes of Normal data |
| 34 | Header | AF Head | 128 bytes of Turbo data 2 | 54bytes of Normal data |
| 35 | Header | | 184 bytes of Normal data | |
| 36 | Header | AF Head | 128 bytes of Turbo data 3 | 54bytes of Normal data |
| 37 | Header | AF Head | 128 bytes of Turbo data 1 | 54bytes of Normal data |
| 38 | Header | AF Head | 128 bytes of Turbo data 2 | 54bytes of Normal data |
| 39 | Header | | 184 bytes of Normal data | |
| 40 | Header | AF Head | 128 bytes of Turbo data 3 | 54bytes of Normal data |
| 41 | Header | AF Head | 128 bytes of Turbo data 1 | 54bytes of Normal data |
| 42 | Header | AF Head | 128 bytes of Turbo data 2 | 54bytes of Normal data |
| 43 | Header | | 184 bytes of Normal data | |
| 44 | Header | AF Head | 128 bytes of Turbo data 3 | 54bytes of Normal data |
| 45 | Header | AF Head | 128 bytes of Turbo data 1 | 54bytes of Normal data |
| 46 | Header | AF Head | 128 bytes of Turbo data 2 | 54bytes of Normal data |
| 47 | Header | | 184 bytes of Normal data | |
| 48 | Header | AF Head | 128 bytes of Turbo data 3 | 54bytes of Normal data |
| 49 | Header | AF Head | 128 bytes of Turbo data 1 | 54bytes of Normal data |
| 50 | Header | AF Head | 128 bytes of Turbo data 2 | 54bytes of Normal data |
| 51 | Header | | 184 bytes of Normal data | |
| 52 | Header | AF Head | 128 bytes of Turbo data 3 | 54bytes of Normal data |

FIG. 42

| | 3 bytes | 2 bytes | 128 bytes | 182~128 bytes |
|---|---|---|---|---|
| 1 | Header | AF Head | 128 bytes of Turbo data 1 | 54bytes of Normal data |
| 2 | Header | AF Head | 128 bytes of Turbo data 2 | 54bytes of Normal data |
| 3 | Header | AF Head | 128 bytes of Turbo data 4 | 54bytes of Normal data |
| 4 | Header | AF Head | 128 bytes of Turbo data 3 | 54bytes of Normal data |
| 5 | Header | AF Head | 128 bytes of Turbo data 1 | 54bytes of Normal data |
| 6 | Header | AF Head | 128 bytes of Turbo data 2 | 54bytes of Normal data |
| 7 | Header | AF Head | 128 bytes of Turbo data 4 | 54bytes of Normal data |
| 8 | Header | AF Head | 128 bytes of Turbo data 3 | 54bytes of Normal data |
| 9 | Header | AF Head | 128 bytes of Turbo data 1 | 54bytes of Normal data |
| 10 | Header | AF Head | 128 bytes of Turbo data 2 | 54bytes of Normal data |
| 11 | Header | AF Head | 128 bytes of Turbo data 4 | 54bytes of Normal data |
| 12 | Header | AF Head | 128 bytes of Turbo data 3 | 54bytes of Normal data |
| 13 | Header | AF Head | 128 bytes of Turbo data 1 | 54bytes of Normal data |
| 14 | Header | AF Head | 128 bytes of Turbo data 2 | 54bytes of Normal data |
| 15 | Header | AF Head | reserved for PCR(6 bytes) | 171 bytes of Normal data |
| 16 | Header | AF Head | 128 bytes of Turbo data 3 | 54bytes of Normal data |
| 17 | Header | AF Head | 128 bytes of Turbo data 1 | 54bytes of Normal data |
| 18 | Header | AF Head | 128 bytes of Turbo data 2 | 54bytes of Normal data |
| 19 | Header | AF Head | 128 bytes of Turbo data 4 | 54bytes of Normal data |
| 20 | Header | AF Head | 128 bytes of Turbo data 3 | 54bytes of Normal data |
| 21 | Header | AF Head | 128 bytes of Turbo data 1 | 54bytes of Normal data |
| 22 | Header | AF Head | 128 bytes of Turbo data 2 | 54bytes of Normal data |
| 23 | Header | AF Head | 128 bytes of Turbo data 4 | 54bytes of Normal data |
| 24 | Header | AF Head | 128 bytes of Turbo data 3 | 54bytes of Normal data |
| 25 | Header | AF Head | 128 bytes of Turbo data 1 | 54bytes of Normal data |
| 26 | Header | AF Head | 128 bytes of Turbo data 2 | 54bytes of Normal data |
| 27 | Header | AF Head | 128 bytes of Turbo data 4 | 54bytes of Normal data |
| 28 | Header | AF Head | 128 bytes of Turbo data 3 | 54bytes of Normal data |
| 29 | Header | AF Head | 128 bytes of Turbo data 1 | 54bytes of Normal data |
| 30 | Header | AF Head | 128 bytes of Turbo data 2 | 54bytes of Normal data |
| 31 | Header | AF Head | 128 bytes of Turbo data 4 | 54bytes of Normal data |
| 32 | Header | AF Head | 128 bytes of Turbo data 3 | 54bytes of Normal data |
| 33 | Header | AF Head | 128 bytes of Turbo data 1 | 54bytes of Normal data |
| 34 | Header | AF Head | 128 bytes of Turbo data 2 | 54bytes of Normal data |
| 35 | Header | AF Head | 128 bytes of Turbo data 4 | 54bytes of Normal data |
| 36 | Header | AF Head | 128 bytes of Turbo data 3 | 54bytes of Normal data |
| 37 | Header | AF Head | 128 bytes of Turbo data 1 | 54bytes of Normal data |
| 38 | Header | AF Head | 128 bytes of Turbo data 2 | 54bytes of Normal data |
| 39 | Header | AF Head | 128 bytes of Turbo data 4 | 54bytes of Normal data |
| 40 | Header | AF Head | 128 bytes of Turbo data 3 | 54bytes of Normal data |
| 41 | Header | AF Head | 128 bytes of Turbo data 1 | 54bytes of Normal data |
| 42 | Header | AF Head | 128 bytes of Turbo data 2 | 54bytes of Normal data |
| 43 | Header | AF Head | 128 bytes of Turbo data 4 | 54bytes of Normal data |
| 44 | Header | AF Head | 128 bytes of Turbo data 3 | 54bytes of Normal data |
| 45 | Header | AF Head | 128 bytes of Turbo data 1 | 54bytes of Normal data |
| 46 | Header | AF Head | 128 bytes of Turbo data 2 | 54bytes of Normal data |
| 47 | Header | AF Head | 128 bytes of Turbo data 4 | 54bytes of Normal data |
| 48 | Header | AF Head | 128 bytes of Turbo data 3 | 54bytes of Normal data |
| 49 | Header | AF Head | 128 bytes of Turbo data 1 | 54bytes of Normal data |
| 50 | Header | AF Head | 128 bytes of Turbo data 2 | 54bytes of Normal data |
| 51 | Header | AF Head | 128 bytes of Turbo data 4 | 54bytes of Normal data |
| 52 | Header | AF Head | 128 bytes of Turbo data 3 | 54bytes of Normal data |

TRANSMITTER AND SYSTEM FOR TRANSMITTING/RECEIVING DIGITAL BROADCASTING STREAM AND METHOD THEREOF

CROSS-REFERENCE TO RELATED APPLICATIONS

This application is a continuation of application Ser. No. 11/416,245 filed on May 3, 2006, now pending, which claims the benefit under 35 U.S.C. §119(a) of U.S. Provisional Application No. 60/755,150, filed on Jan. 3, 2006 in the United States Patents and Trademark Office, the entire disclosure of which is incorporated herein by reference.

BACKGROUND OF THE INVENTION

1. Field of the Invention

An aspect of the present invention generally relates to a method of robustly processing and transmitting a digital broadcasting transport stream (TS), digital broadcasting transmission and reception systems, and signal processing methods thereof. More particularly, an aspect of the present invention relates to a method of robustly processing and transmitting the digital broadcasting TS, the digital broadcasting transmission and reception systems, which aim at the reception performance improvement of the ATSC VSB scheme, which is the U.S.A. terrestrial DTV system, through the information exchange and the mapping with respect to a dual TS including a normal stream and a turbo stream.

2. Description of the Related Art

The Advanced Television System Committee (ATSC) vestigial sideband (VSB) scheme, which is terrestrial digital broadcasting system used in the U.S.A., employs a single carrier and a field sync signal of 312 segments. Thus, reception performance of the broadcasting system deteriorates in a poor channel, specifically, in a doppler fading channel.

FIG. 1 is a block diagram of a transmitter and a receiver according to the ATSC DTV standard, which is the typical U.S.A. terrestrial digital broadcasting system. The digital broadcasting transmitter of FIG. 1 is the EVSB system suggested by Philips, and constructed to generate and transmit a dual stream in which robust data is added to normal data of the existing ATSC VSB system.

As shown in FIG. 1, the digital broadcasting transmitter includes a randomizer 11, which randomizes the dual stream, a Reed-Solomon (RS) encoder 12, which is a concatenated coder type to add a parity byte to the TS to correct errors occurring due to the channel characteristics in the transmission, an interleaver 13, which interleaves the RS-encoded data in a certain pattern, and a trellis encoder 14, which trellis-encodes the interleaved data at a ⅔ rate and maps to 8-level symbols. The digital broadcasting transmitter carries out the error correction coding with respect to the dual stream.

The digital broadcasting transmitter also includes a multiplexer 15 and a modulator 16. The multiplexer 15 inserts a field sync signal and a segment sync signal to the data which is passed through the error correction coding process and hardware, as shown in data format of FIG. 2. The modulator 16 inserts a pilot tone by adding a certain DC value to the data symbol having the inserted segment and field sync signals, performs the VSB modulation by the pulse shaping, up-converts it to a signal of a RF channel band, and transmits it.

According to the dual stream scheme which transmits the normal data and the robust data through a single channel, the normal data and the robust data are each multiplexed (not shown) and fed to the randomizer 11. The input data is randomized at the randomizer 11, the randomized data is outer-coded at the RS encoder, which is an outer coder, and the coded data is spread out at the interleaver 13. The interleaved data is inner-coded by 12 symbols at the trellis encoder 14. After the inner-coded data is mapped to 8-level symbols, the field sync signal and the segment sync signal are inserted. Next, the data is VSB-modulated by inserting the pilot tone, converted to the RF signal, and transmitted.

Meanwhile, the digital broadcasting receiver of FIG. 1 includes a tuner (not shown), which converts the RF signal received through the channel to a baseband signal, a demodulator 21, which performs the sync detection and the modulation with respect to the converted baseband signal, an equalizer 22, which compensates for channel distortion with respect to the demodulated signal, a viterbi decoder 23, which corrects error of the equalized signal and decodes to symbol data, a deinterleaver 24, which rearranges the data spread by the interleaver 13 of the digital broadcasting transmitter, a RS decoder 25, which corrects errors, and a derandomizer 26, which outputs a MPEG-2 TS by derandomizing the data corrected by the RS decoder 25.

Accordingly, the digital broadcasting receiver of FIG. 1 restores the original signal by down-converting the RF signal in the reverse operation of the digital broadcasting transmitter, demodulating and equalizing the converted signal, and performing the channel decoding.

FIG. 2 shows a VSB data frame of the U.S.A. digital broadcasting (8-VSB) system, in which the segment sync signal and the field sync signal are inserted. As shown in FIG. 2, one frame includes 2 fields, and one field includes a field sync segment, which is the first segment, and 312 data segments. In the VSB data frame, one segment corresponds to one MPEG-2 packet, and one segment includes a 4-symbol segment sync signal and 828 data symbols.

As shown in FIG. 2, the sync signals, which include the segment sync signal and the field sync signal, are used for the synchronization and the equalization of the received RF signal at the digital broadcasting receiver. That is, the field sync signal and the segment sync signal are known to the digital broadcasting transmitter and the digital broadcasting receiver, and used as a reference signal when the receiver carries out the equalization.

The U.S.A. terrestrial digital broadcasting system of FIG. 1, which is constructed to generate and transmit the dual stream by adding the robust data to the normal data of the existing ATSC VSB system, transmits the existing normal data together with the robust data.

However, the U.S.A. terrestrial digital broadcasting system of FIG. 1 cannot improve the poor reception performance in the multipath channel according to the existing normal data stream transmission although the dual stream is transmitted with the added robust data. That is, the U.S.A. terrestrial digital broadcasting system is disadvantageous in that the reception performance is not improved according to the improved normal stream. Additionally, the robust-processed turbo stream does not improve the reception performance greatly in the multipath environment. Additionally, because only one robust stream is processed at a time, the system cannot be adapted to an enhanced broadcasting business model which uses multi-turbo streams.

SUMMARY OF THE INVENTION

The present invention has been made to overcome the above and/or other problems in the related art, and accordingly, it is an aspect of the present invention to provide a digital broadcasting transmission/reception system and a method thereof, capable of processing of multi turbo streams for transmission and reception.

In accordance with an aspect of the present invention, a digital broadcasting transmission system, comprises a turbo processor to detect at least one turbo stream from a dual transport stream (TS) which includes a normal stream multiplexed with the turbo stream, to encode the detected turbo stream, and to replace the turbo stream with the encoded turbo stream in the dual TS; and a transmitter to trellis-encode the dual TS, processed at the turbo processor, and to output the resultant trellis-encoded dual TS, wherein the turbo processor comprises at least one turbo processing block to encode each of the at least one turbo stream.

In accordance with one aspect of the present invention, a digital broadcasting transmission method, comprises detecting at least one turbo stream from a dual transport stream (TS) in which the turbo stream is multiplexed with a normal stream, encoding the detected turbo stream, and replacing the turbo stream with the encoded turbo stream in the dual TS; and trellis-encoding the dual TS, and outputting the resultant trellis-encoded dual TS, wherein the detecting operation encodes the turbo stream using a turbo processing block for each of the at least one turbo streams.

In accordance with one aspect of the present invention, a digital broadcasting reception system, comprises a demodulator to receive a dual transport stream (TS) which includes at least one turbo stream and a normal stream multiplexed together, and to demodulate the received dual TS; an equalizer to equalize the demodulated dual TS; a first processor to decode the normal stream of the equalized TS and to output a normal data packet; and a second processor to decode the at least one turbo stream of the equalized dual TS in parallel with the decoding of the normal stream to recover a turbo stream packet.

In accordance with one aspect of the present invention, a digital broadcasting reception method, comprises receiving and demodulating a dual transport stream (TS) which includes at least one turbo stream and a normal stream multiplexed together; equalizing the decoded dual TS; decoding the normal stream of the equalized dual TS and outputting a normal data packet; and decoding each turbo stream of the equalized dual TS in parallel with the decoding of the normal stream to recover a turbo stream packet.

According to another aspect of the present invention, a method of processing a received broadcasting signal, comprises receiving and demodulating a dual transport stream (TS) which includes a turbo stream and a normal stream multiplexed together; equalizing the decoded dual TS; viterbi-decoding the normal stream of the equalized dual TS and outputting a normal data packet; turbo-decoding each turbo stream of the equalized dual TS in parallel with the viterbi-decoding of the normal stream; inserting the turbo-decoded turbo stream into the viterbi-decoded dual TS; deinterleaving the dual TS in which the turbo-decoded turbo stream is inserted; Reed-Solomon (RS) decoding the deinterleaved dual TS; derandomizing the RS decoded dual TS; and demultiplexing the derandomized dual TS, to recover a normal stream packet and a turbo stream packet.

Additional and/or other aspects and advantages of the invention will be set forth in part in the description which follows and, in part, will be obvious from the description, or may be learned by practice of the invention.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 14 is a block diagram of a digital broadcasting transmission system according to another embodiment of the present invention;

FIGS. 16A through 16E are conceptual diagrams for illustrating a structure of a dual TS which is transmitted from the digital broadcasting transmission system of FIGS. 3, 4, 9 and 14;

FIG. 17 is a block diagram of a digital broadcasting transmission system according to still another embodiment of the present invention;

FIGS. 21A through 21E are conceptual diagrams for illustrating various structures of a dual TS which is transmitted from the digital broadcasting transmission system of FIG. 17;

FIG. 24 is a block diagram of a compatibility parity generator;

FIG. 25 is a block diagram of a digital broadcasting transmission system according to a further embodiment of the present invention;

FIG. 26 is a block diagram of a digital broadcasting reception system according to one embodiment of the present invention;

FIG. 28 is a block diagram of a digital broadcasting reception system according to another embodiment of the present invention;

FIGS. 40 through 42 illustrate exemplary structure of a dual TS which includes multi turbo streams.

DETAILED DESCRIPTION OF THE EMBODIMENTS

Figure 1:
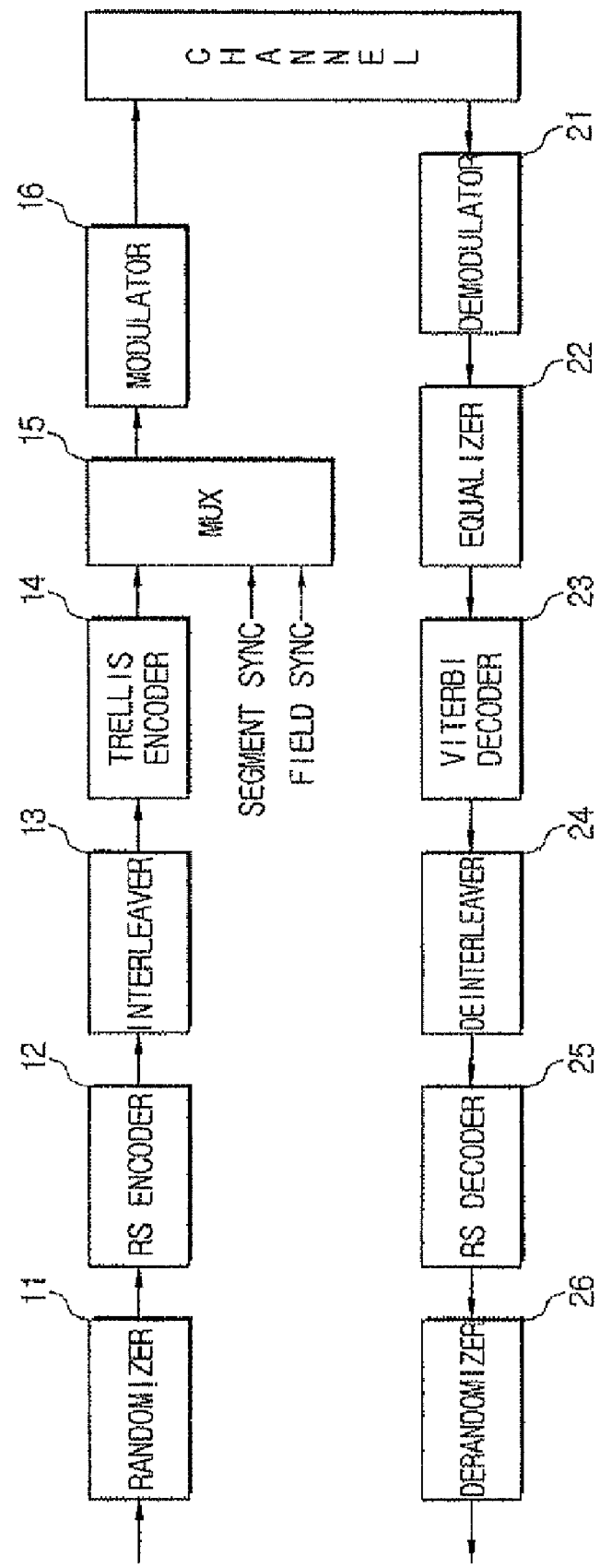
FIG. 1 is a block diagram of a conventional digital broadcasting (ATSC VSB) transmission and reception system.
Figure 2:
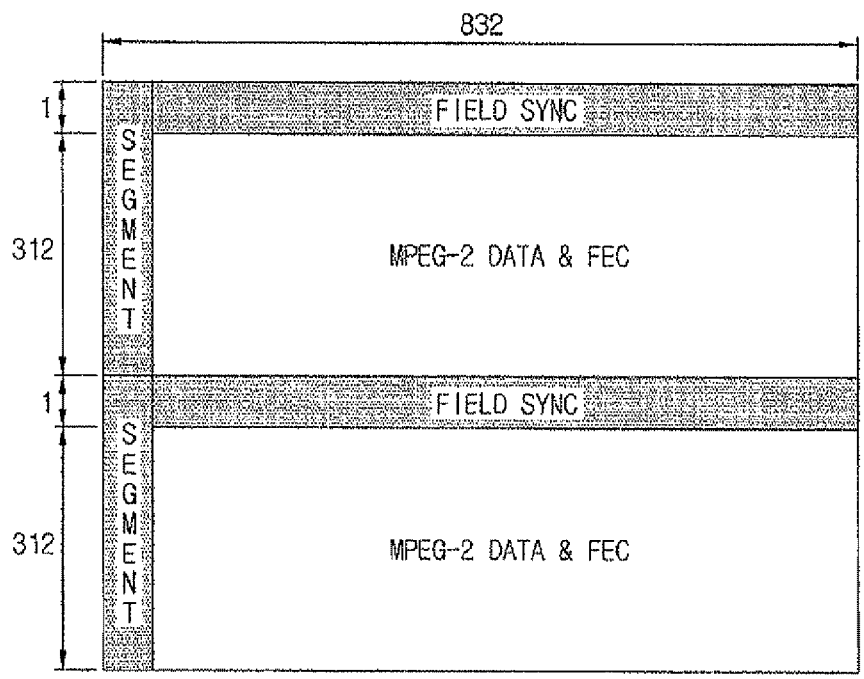
FIG. 2 is a diagram of a frame structure of conventional ATSC VSB data.

Reference will now be made in detail to the embodiments of the present invention, examples of which are illustrated in the accompanying drawings, wherein like reference numerals refer to the like elements throughout. The embodiments are described below to explain the present invention by referring to the figures.

Figure 3:
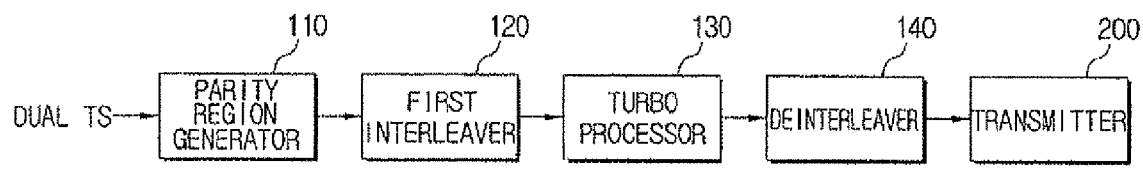
FIG. 3 is a block diagram of a digital broadcasting transmission system according to one embodiment of the present invention.

FIG. 3 is a block diagram of a digital broadcasting transmission system, according to one embodiment of the present invention. In FIG. 3, the digital broadcasting transmission system comprises a parity region generator 110, a first interleaver 120, a turbo processor 130, a deinterleaver 140, and a transmitter 150. The parity region generator 110 generates a parity insertion region with respect to a dual transport stream (TS), which includes a normal stream and a turbo stream. The parity insertion region denotes a region to which a parity bit that is calculated for the dual TS is inserted, that is, a region to which a parity bit is recorded. The parity insertion region provided by the parity region generator 110 is hereinafter referred to as "a first parity insertion region."

The first interleaver 120 interleaves the dual TS having the first parity insertion region generated by the parity region generator 110.

The turbo processor 130 detects only the turbo stream included in the interleaved dual TS, performs robust processing on the detected turbo stream, and stuffs the processed turbo stream into the dual TS. The robust processing is a process to make data robust by carrying out the encoding, such as the convolution encoding, with respect to the turbo stream.

The deinterleaver 140 deinterleaves the dual TS output from the turbo processor 130.

The transmitter 200 transmits the dual TS that is processed at the deinterleaver 140, to an external device (not shown). The transmitter 200 will be explained in detail below.

As shown in the embodiment of FIG. 3, by transmitting the turbo stream, which is passed through the separate robust processing, together with the normal stream, the reception performance in a multipath environment or mobile environment may be improved and compatibility with an existing normal stream transmission and reception stream may be provided.

Figure 4:
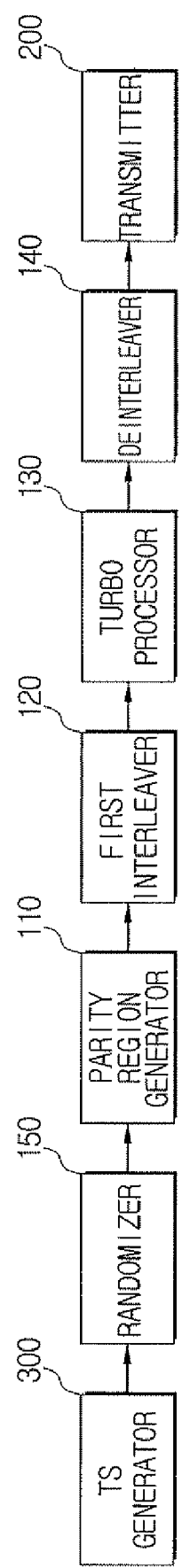
FIG. 4 is a detail block diagram of the digital broadcasting transmission system of FIG. 3.

FIG. 4 is a detailed block diagram of the digital broadcasting transmission system of FIG. 3. As shown in FIG. 4, the digital broadcasting transmission system further includes a TS generator 300 and a randomizer 150. The TS generator 300 may comprise an ATSC emission multiplexer (MUX), although it is understood that there are other suitable multiplexers available and that the use of the ATSC emission multiplexer is not intended to limit the scope of the application.

The TS generator 300 generates a dual TS by receiving and multiplexing the normal stream and the turbo stream. The normal stream and the turbo stream may be received from an internal module such as a broadcasting camera, various internal modules such as a compressing module (e.g., MPEG 2 module), a video encoder, and an audio encoder.

The randomizer 150 randomizes the dual TS generated at the TS generator 300 and provides the randomized dual TS to the parity region generator 110. Accordingly, the parity region generator 110 generates a parity insertion region with respect to the dual TS. The elements in FIG. 4, excluding the TS generator 300 and the randomizer 150, have like functions with those in FIG. 3. Thus, their descriptions will be omitted.

Figure 5A:
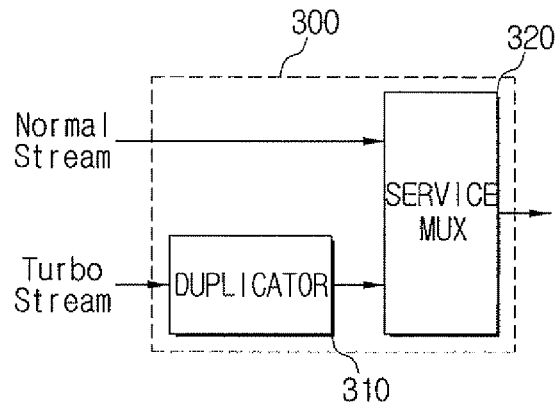
FIGS. 5A, 5B, and 5C are block diagrams of a TS generator according to various embodiments of the present invention.
Figure 5B:
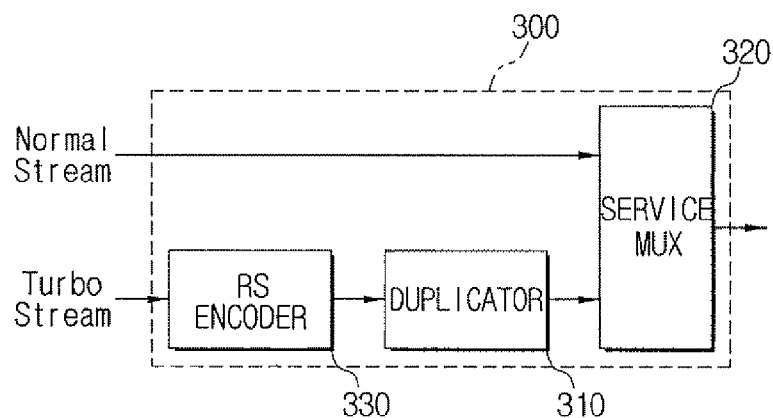
Figure 5C:
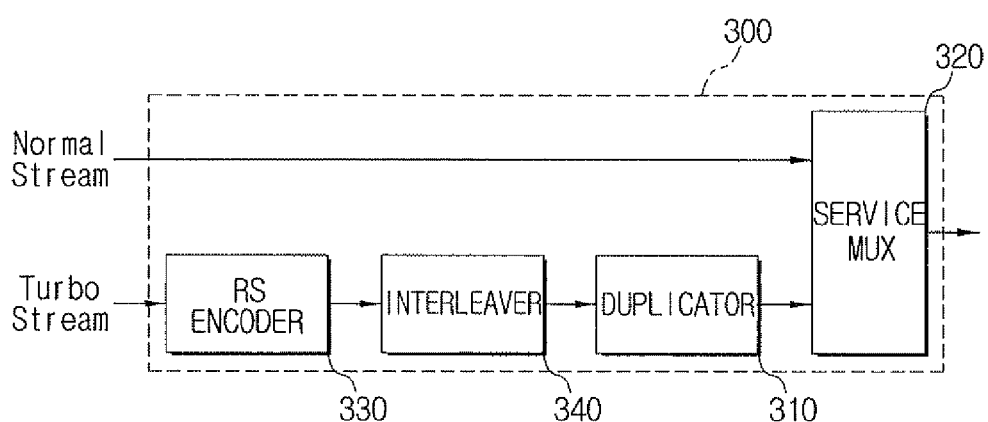

FIGS. 5A, 5B, and 5C are block diagrams of the TS generator 300 according to various embodiments of the present invention. As shown in FIG. 5A, the TS generator 300 is implemented by including a duplicator 310 and a service multiplexer (MUX) 320. The duplicator 310 generates a parity insertion region with respect to the interleaved turbo stream. Here, the parity insertion region generated by the duplicator 310 is referred to as "a second parity insertion region." In more detail, to generate the second parity insertion region, bytes, which are constituent units of the turbo stream, are divided into two or four bytes. Each of the divided bytes is filled with parts of bit values of the original byte and null data (e.g., 0). The region filled with the null data becomes the parity insertion region.

The operation of the duplicator 310 will now be described in more detail.

Where the input is doubled, provided that bits in one byte are represented by a, b, c, d, e, f, g, h starting from the most significant bit (MSB) and input in that order, the output of the duplicator 310 is represented by a, a, b, b, c, c, d, d, e, e, f, f, g, g, h, h. Here, it is noted that, starting from the MSB, a 2-byte output including 1 byte of a, a, b, b, c, c, d, d and a 1 byte output including "e, e, f, f, g, g, h, h are output in succession.

Where the input is quadrupled, the output of the duplicator 310 is expressed as a, a, a, a, b, b, b, b, c, c, c, c, d, d, d, d, e, e, e, e, f, f, f, f, g, g, g, g, h, h, h, h. As such, 4 bytes are output. Meanwhile, the duplicator 310 may fill positions other than the designated position, with an arbitrary value, that is, with null data, without having to duplicate the input bits. For instance, when doubling the input, the duplicator 310 may maintain the former part of two successive bits in the original input, and input an arbitrary value in the latter part, such as a, x, b, x, c, x, . . . , instead of a, a, b, b, c, c, . . . . Conversely, the latter part of the original input may be maintained. Where the output is quadrupled, the original input is arranged at one of first, second, third, and fourth positions and other positions are filled with arbitrary values, which will be explained below.

The service MUX 320 multiplexes the normal stream that is received separately and the turbo stream that is processed at the duplicator 310. Thus, the dual TS is generated and provided to the randomizer 150.

FIG. 5B is a block diagram to illustrate an example in which a Reed-Solomon (RS) encoder 330 is added to the TS generator 300 of FIG. 5A. In FIG. 5B, the RS encoder 330 encodes the received turbo stream by adding a parity bit, and then provides the encoded turbo stream to the duplicator 310. Hence, the duplicator 310 generates the second parity insertion region to the encoded turbo stream. In doing so, the duplicator 310 generates the second parity insertion region at a ½ or ¼ rate.

FIG. 5C is a block diagram to illustrate an example in which an interleaver 340 is added to the TS generator 300 of FIG. 5B. The interleaver 340 interleaves the turbo stream encoded by the RS encoder 330. Here, it is noted that the interleaver 340 may be referred to as "a free-interleaver." It is also noted that positions of the interleaver 340 and the duplicator 310, shown in FIG. 5C, may be switched in various embodiments of the invention.

Figure 6:
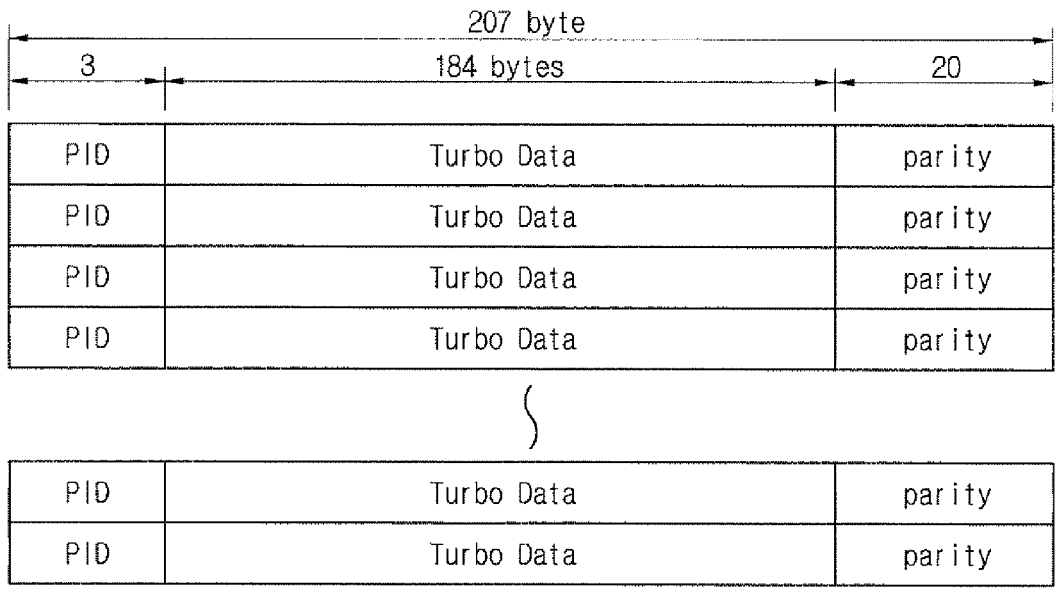
FIG. 6 is a conceptual diagram of an output stream structure of a RS encoder in the TS generator.

FIG. 6 is a conceptual diagram of a turbo stream structure output from the RS encoder 330 of FIGS. 5B and 5C. As shown in FIG. 6, while a sync signal of 1 byte is removed from the 188-byte turbo stream, as initially received, a packet stream of 208 bytes is output with a 20-byte parity region added.

Figure 7A:
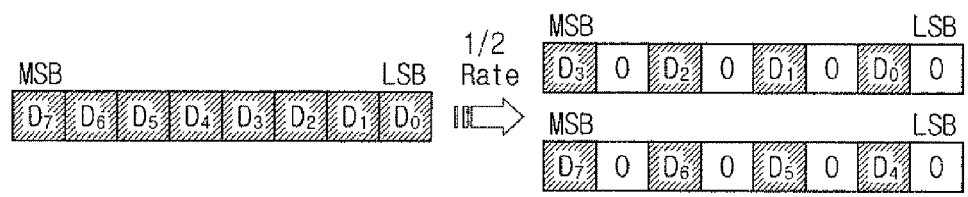
FIGS. 7A and 7B are conceptual diagram for illustrating how a parity insertion region is provided at the TS generator which is applied to the digital broadcasting transmission system of FIG. 4.
Figure 7B:
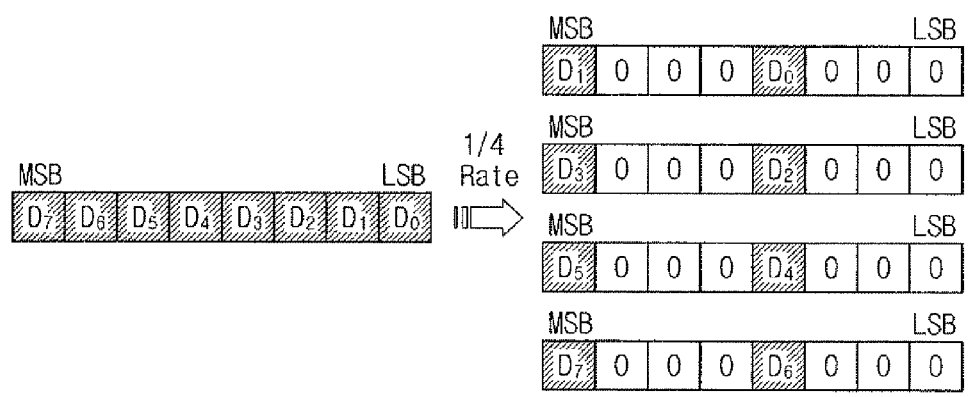

FIGS. 7A and 7B are conceptual diagrams to illustrate how a parity insertion region is provided by the duplicator 310. First, FIG. 7A shows a ½ rate conversion process. As shown in FIG. 7A, one byte including D0~D7 bits is expanded to a first byte including D0~D3 bit and a second byte including D4~D7 bit. Bits between the first byte and the second byte are used as the first parity insertion region. Specifically, as for the first and second bytes, 2, 4, 6, and $8^{th}$ bits are used as the first parity insertion region. It is noted that the position of the first parity insertion region may be changed. For instance, 2, 3, 6 and $7^{th}$ bits or 3, 4, 5 and $6^{th}$ bits may be used as the first parity insertion region.

FIG. 7B shows a ¼ rate conversion. As shown in FIG. 7B, one byte including D0~D7 bits is expanded to a first byte including D0 and D1 bits, a second byte including D2 and D3 bits, a third byte including D4 and D5 bits, and a fourth byte including the D6 and D7 bits. Although 2, 3, 4, 6, 7 and $8^{th}$ bits of each byte are used as the first parity insertion region in FIG. 7B, this example is not intended to limit the scope of the application and should not be interpreted to do so.

Figure 8:
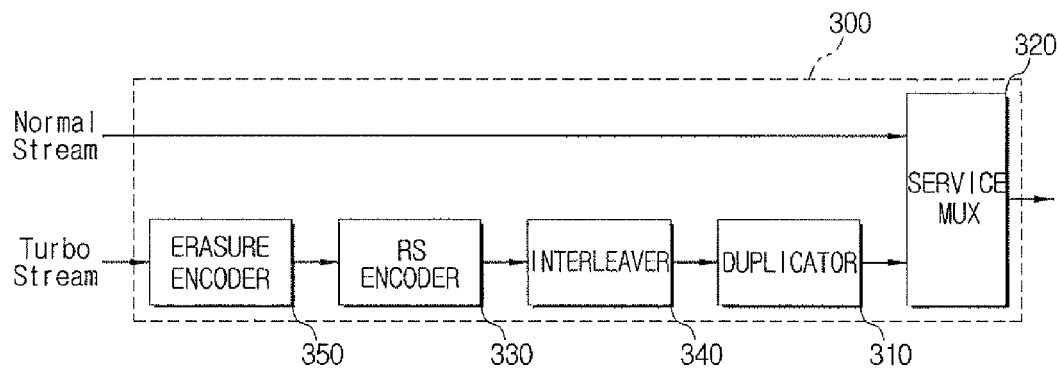
FIG. 8 is a block diagram of a TS generator which employs an erasure encoder.

FIG. 8 is another block diagram of a TS generator 300. Here, the TS generator 300 of FIG. 8 also includes an erasure encoder 350, which is added to the TS generator 300 of FIG. 5C. The erasure encoder 350 performs erasure encoding to eliminate noise in the received turbo stream. By eliminating noise from the turbo stream, reception performance may be improved. The RS encoder 330 carries out the error correction encoding with respect to the turbo stream which has passed through the erasure encoding, and the interleaver 340 interleaves the encoded turbo stream. The duplicator 310 generates a second parity insertion region in the interleaved turbo stream. The service MUX 320 generates a dual TS by multiplexing the turbo stream having the second parity insertion region and the normal stream.

Figure 9:
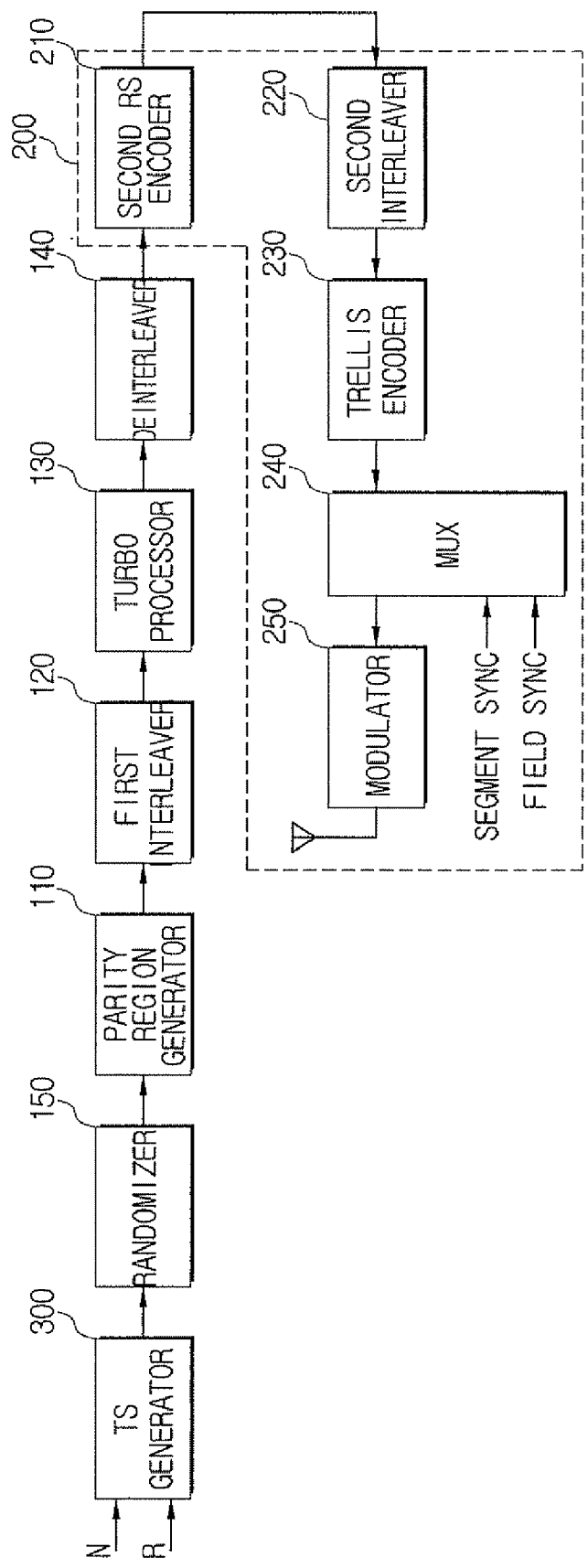
FIG. 9 is a detail block diagram of the digital broadcasting transmission system of FIG. 4.

FIG. 9 is a detailed block diagram of the transmitter 200, which is applied to the digital broadcasting transmission system of FIG. 4. Referring to FIG. 9, the transmitter 200 includes a second RS encoder 210, a second interleaver 220, a trellis encoder 230, a MUX 240, and a modulator 250. Since the elements, excluding the transmitter 200, have the like functions with those in FIGS. 3 and 4, their detailed descriptions will be omitted. As shown in FIG. 9, the elements, excluding the TS generator 300 may be referred to as exciters.

The second RS encoder 310 encodes the dual transport steam provided from the deinterleaver 220 by adding the parity bits. Specifically, the second RS encoder 210 inserts the parity bits, which are calculated with respect to the dual TS, into the first parity insertion region generated by the parity region generator 110. The second interleaver 220 interleaves the parity-inserted dual TS. The trellis encoder 230 trellis-encodes the dual TS interleaved by the second interleaver 220. The MUX 240 multiplexes the trellis-encoded dual TS by adding a segment sync signal and a field sync signal. The modulator 250 modulates channels of the multiplexed dual TS, up-coverts the modulated stream to a signal of the RF channel band, and then transmits the converted signal to an external device. In particular, the dual TS from the modulator 250 may be transmitted to various reception systems through the channel.

Although it is not illustrated in FIG. 9, the transmitter 200 may further include typical elements for the signal transmission, such as a power amplifier (not shown) to amplify the power of the converted signal and an antenna (not shown).

Figure 10:
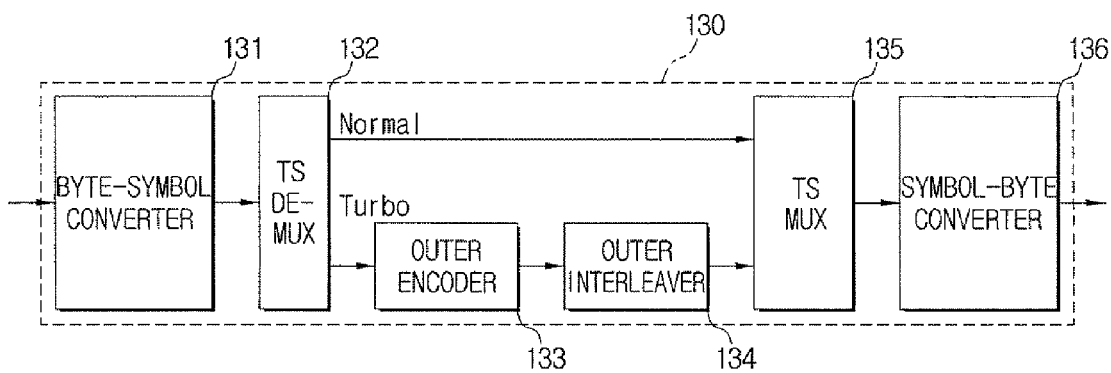
FIG. 10 is a block diagram of a turbo processor according to one embodiment of the present invention.

FIG. 10 is a block diagram of a turbo processor 130 which is applied to the various digital broadcasting transmission systems of FIGS. 3, 4 and 9. As shown in FIG. 10, the turbo processor 130 includes a byte-symbol converter 131, a TS demultiplexer (DE-MUX) 132, an outer encoder 133, an outer interleaver 134, a TX MUX 135, and a symbol-byte converter 136, although it is noted that the byte-symbol converter 131, the TS DE-MUX 132, the TS MUX 135 and the symbol-byte converter 136 may be omitted and replaced by other elements. The byte-symbol converter 131 converts the dual TS interleaved by the first interleaver 120 from bytes to symbols (here, one may refer to the table D5.2 of U.S.A. ATSC DTV Standard (A/53) for detailed descriptions about the conversion from the byte to the symbol). The TS DE-MUX 132 detects the turbo stream by demultiplexing the dual TS that is converted to the symbols. The outer encoder 133 encodes the turbo stream by calculating a parity bit for the detected turbo stream and by inserting the calculated parity bit into the second parity insertion region. In doing so, the outer encoder 133 encodes the turbo stream byte by byte. The outer interleaver 134 interleaves the convolutionally encoded turbo stream. The outer interleaver 134 carries out the interleaving byte by bit. The TS MUX 135 constructs the dual TS by multiplexing the interleaved turbo stream and the normal stream. Specifically, the TS MUX 135 constructs the dual TS by stuffing the turbo stream to the position prior to the detection of the TS DE-MUX 132. The TS MUX 135 may be referred to as a service MUX. The symbol-byte converter 136 converts the dual TS from the symbols to the bytes (here, one may refer to the table D5.2 of U.S.A. ATSC DTV Standard (A/53) for more descriptions about the conversion from the symbol to the byte).

Figure 11:
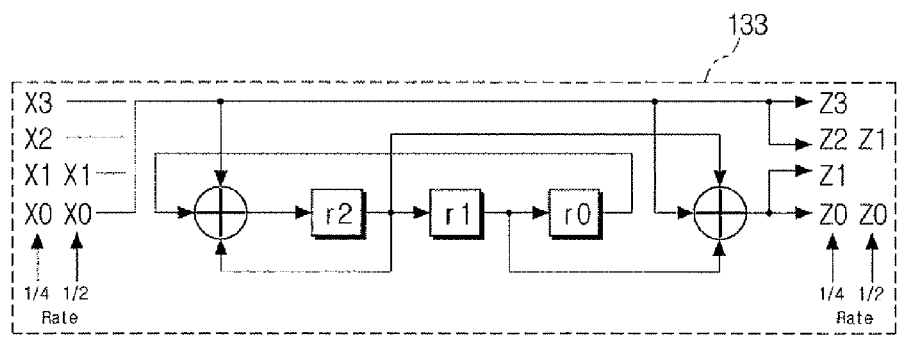
FIG. 11 is a block diagram of an outer encoder which is applied to the turbo processor of FIG. 10.

FIG. 11 is a block diagram of the outer encoder 133, which is applied to the turbo processor 130 of FIG. 10. As shown in FIG. 11, the outer encoder includes 133 a shift register r0, r1 and r2, and an adder. Accordingly, the outer encoder 133 inserts the parity bit into the second parity insertion region by convolutionally encoding in the type of recursive systematic convolutional (RSC) code. The outer encoder 133 is able to encode at a ½ rate or a ¼ rate. The encoding at the outer encoder 2 is illustrated in reference to FIGS. 12A and 12B.

Figure 12A:
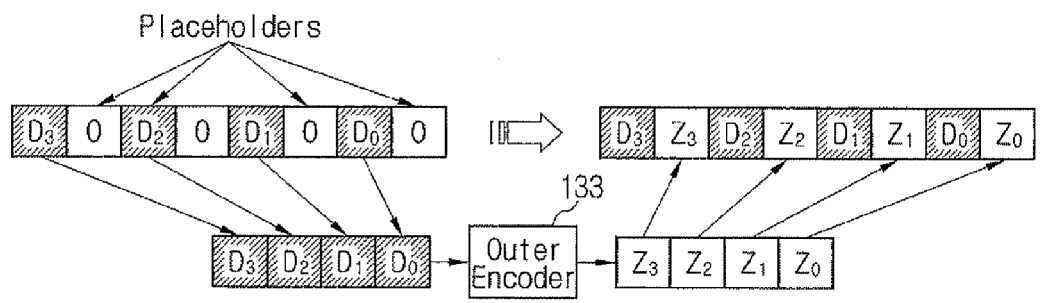
FIGS. 12A and 12B are conceptual diagrams for illustrating an operation of an outer encoder applied to the turbo processor of FIG. 10.

FIG. 12A is a conceptual diagram to illustrate the ½ rate. As shown in FIG. 12A, parity bits Z0~Z3, corresponding to D0~D3 bits are generated in one byte including the D0~D3 bits and null data (e.g., 0). The generated parity bits are inserted at the positions of the null data, that is, the second parity insertion regions. As a result, the encoded byte is D3, Z3, D2, Z2, D1, Z1, D0, Z0.

Figure 12B:
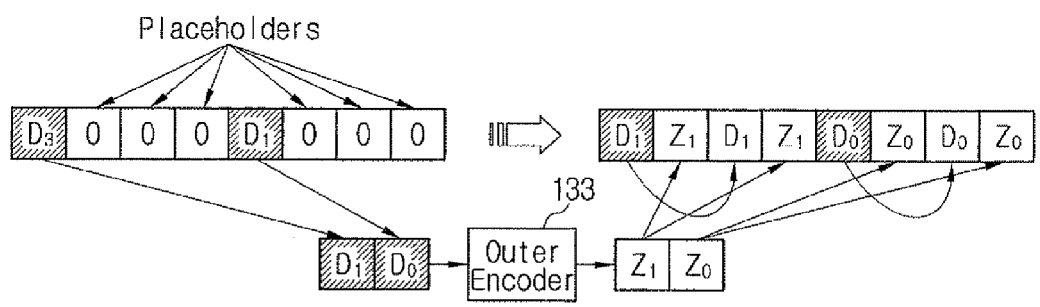

FIG. 12B is a conceptual diagram to illustrate at the ¼ rate. As shown in FIG. 12B, parity bits Z0 and Z1 corresponding to D0 and D1 bits are generated in one byte including D0 and D1 bits and null data. The generated parity bits are inserted at the positions of the null data, that is, the second parity insertion region. In addition to the generated parity bits, D0 and D1 bits are then re-inserted. Hence, the D0 and D1 bits and the parity bits can be recorded repeatedly. As shown in FIG. 12B, the encoded byte is D1, Z1, D1, Z1, D0, Z0, D0, Z0.

Figure 13:
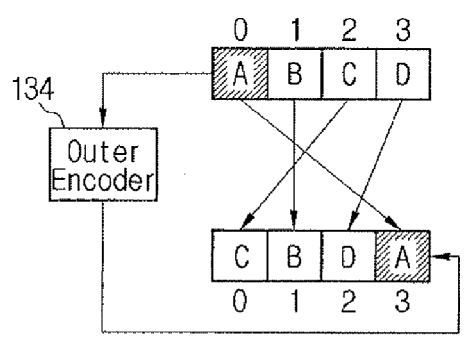
FIG. 13 is a conceptual diagram for illustrating an operation of an outer interleaver applied to the turbo processor of FIG. 10.

FIG. 13 is a conceptual diagram to illustrate the interleaving of the outer interleaver 134. Referring to FIG. 13, the outer interleaver 134 interleaves according to a certain interleaving rule. For instance, when data ABCD is input in order while the interleaving rule is {2, 1, 3, 0}, the outer interleaver 134 interleaves and outputs data CBDA.

FIG. 14 is a block diagram of a digital broadcasting transmission system according to another embodiment of the present invention. Referring now to FIG. 14, the digital broadcasting transmissions system includes a TS generator 500, a randomizer 410, an RS encoder 420, an interleaver 430, a turbo processor 440, a trellis encoder 450, a MUX 460, a pilot inserter 470, a pre-equalizer 480, a VSB modulator 490, and an RF modulator 495.

The TS generator 500 constructs a dual TS by receiving and multiplexing a normal stream and a turbo stream. In more detail, the turbo stream and the normal stream are received separately. After processing, such as encoding and interleaving, the turbo stream, the processed turbo stream and the normal stream are multiplexed to generate the dual TS. It is noted that the TS generator 500 may be implemented in the structure in a similar manner as that of the TS generator 300 of FIGS. 5A, 5B, 5C and 8.

The randomizer 410 receives and randomizes the dual TS output from the TS generator 500. The RS encoder 420 encodes the randomized dual TS by inserting a parity for error correction. The interleaver 430 interleaves the parity-inserted dual TS. The turbo processor 440 convolutionally encodes the turbo stream included in the interleaved dual TS, and interleaves the convolutionally encoded turbo stream. Next, the turbo processor 440 reconstructs the dual TS by inserting the interleaved turbo stream into the dual TS.

Meanwhile, in the digital broadcasting transmission system of FIG. 9, the turbo processor 130 is positioned at the front end of the second RS encoder 210. This allows the parity bits to be inserted correctly since the parity bits are re-inserted after the turbo stream, including inserted parity bits by the convolutional encoding, is inserted to the dual TS. However, in the digital broadcasting transmission system of FIG. 14, the turbo processor 440 is positioned at the back end of the RS encoder 420. Thus, as the parity bits are inserted by the convolutional encoding of the turbo processor 440, the whole parity of the dual TS is changed. Here, the turbo processor 440 corrects the parity by regenerating and inserting the parity with respect to the reconstructed dual TS.

The trellis encoder 450 trellis-encodes the turbo-processed dual TS. The MUX 460 can multiplex the trellis-encoded dual TS by adding a segment sync signal and a field sync signal. The pilot inserter 470 inserts a pilot by adding a certain DC value to the dual TS having the sync signals. The pre-equalizer 480 equalizes the pilot-inserted dual TS to minimize intersymbol interference. The VSB modulator 490 VSB-modulates the equalized dual TS. The RF modulator 495 modulates the VSB-modulated dual TS to a signal of the RF channel band.

The digital broadcasting transmission system of FIG. 14 has a more simplified structure than that of FIG. 9 because the elements, such as parity region generator 110, the first interleaver 120, and the deinterleaver 140 are omitted.

Figure 15:
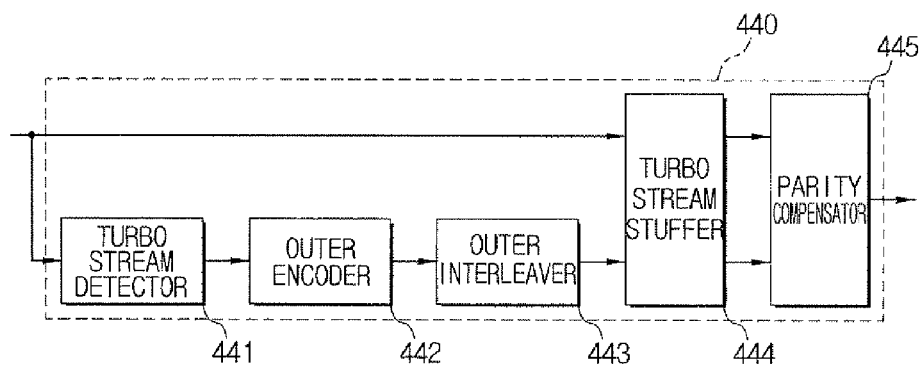
FIG. 15 is a block diagram of a turbo processor which is applied to the digital broadcasting transmission system of FIG. 14.

FIG. 15 is a block diagram of the turbo processor 440 which is applied to the digital broadcasting transmission system of FIG. 14. As shown in FIG. 15, the turbo processor 440 includes a turbo stream detector 441, an outer encoder 442, an outer interleaver 443, a turbo stream stuffer 444, and a parity compensator 445.

The turbo stream detector 441 detects the turbo stream from the dual TS. Specifically, the turbo stream detector 441 can be implemented using demultiplexing (DE-MUX). The outer encoder 442 encodes the turbo stream by adding the parity bit to the first parity insertion region in the detected turbo stream. The outer interleaver 443 interleaves the encoded turbo stream. The turbo stream stuffer 444 reconstructs the dual TS by multiplexing the interleaved turbo stream and the normal stream. The turbo stream stuffer 444 may be implemented using the MUX. The parity compensator 445 compensates for the parity error resulting from the turbo stream encoding by regenerating and adding the parity bit to the reconstructed dual TS.

The turbo processor 440 of FIG. 15 may further include a byte-symbol converter (not shown) to convert the dual TS from the bytes to the symbols and to provide the converted dual TS to the turbo stream detector 41, and a symbol-byte converter (not shown) to convert the dual TS output from the parity compensator 445 from the symbols to the bytes and to output the converted dual TS.

FIGS. 16A through 16E are conceptual diagrams to illustrate various structures of the dual TS, which is transmitted from the digital broadcasting transmission system of FIGS. 3, 4, 9 and 14.

Figure 16A:
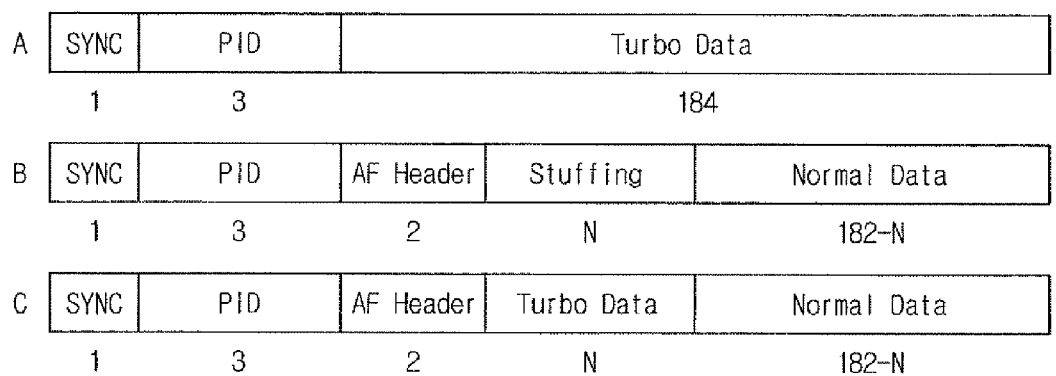

In FIG. 16A, A shows the normal stream packet received at the TS generator 300, 500, B shows the turbo stream packet received at the TS generator 300, 500, and C shows the dual TS packet constructed at the TS generator 300, 500. As shown in FIG. 16A, the turbo stream packet A comprises a sync signal, a packet identity (PID), and a robust data region. More specifically, the whole turbo stream packet comprises 188 bytes, in which the sync signal is 1 byte, the PID is 3 bytes, and the robust data is 184 bytes.

The normal stream packet B comprises a sync signal (SYNC), a PID, an adaptation field (AF) header, a stuffing region, and a normal data region. Specifically, the whole normal stream packet comprises 188 bytes, in which the SYNC is 1 byte, the PID is 3 bytes, the AF header is 2 bytes, and null data is N bytes, and the normal data is 182-N-S bytes. The AF header is a region where information is recorded to inform position, size and the like of the AF.

In the dual TS C, part of the turbo stream packet A is inserted to the stuffing region of the normal stream packet. Still referring to FIG. 16A, the 188-byte dual TS packet comprises 1-byte SYNC, 3-byte PID, 2-byte AF header, N-byte robust data, and 182-N-byte normal data.

The turbo stream that is inserted to the dual TS C may be part of the turbo stream packet A. In other words, the turbo stream that is inserted to the dual TS C may be at least one of the SYNC, the PID and the robust data.

FIG. 16B shows another example of the dual TS constructed by the TS generator 300 and 500. As shown in FIG. 16B, the dual TS comprises a plurality of successive packets, in which robust data is positioned in specific packets. In more detail, FIG. 16B shows that the turbo stream 78 packets are inserted to 312 packets of the dual TS 1 field. In this case, the dual TS is constructed such that the turbo stream and the normal stream packets are repeated in the ratio of 1:3 by four packets. That is, 1 packet of the turbo stream (188 bytes) and three packets of the normal stream (188 bytes) are connected in succession.

Where the turbo stream 70 packets are inserted into 312 segments of the dual TS, the dual TS is constructed such that four packets comprising a turbo stream 1 packet (188 bytes) and normal stream 3 packets (188 bytes) in a 1:3 ratio are repeatedly arranged 70 times. The remaining 32 packets comprise the normal stream packet.

FIG. 16C shows still another example of the dual TS constructed by the TS generator 300, 500. Specifically, FIG. 16C is a conceptual diagram to illustrate the exemplary dual TS when the turbo stream 88 packets are inserted in a packet of 312 segments of the dual TS 1 field. As shown in FIG. 16C, the dual TS is constructed such that the turbo stream 2 packets (188 bytes) and the normal stream 2 packets (188 bytes) are repeatedly arranged 10 times in packets of four, and that the turbo stream 1 packet (188 bytes) and the normal stream 3 packets (188 bytes) are arranged repeatedly in packets of four in the 1:3 ratio with respect to the other segments.

FIG. 16D shows yet another example of the dual TS constructed by the TS generator 300 and 500. FIG. 16D shows the dual TS which is the combination of those of FIGS. 16A and 16B. Specifically, the dual TS is constructed such that a turbo stream 1 packet (188 bytes), a packet having the turbo stream inserted in part of the AF of the normal stream packet, and normal stream 2 packets are repeatedly arranged in packets of four.

FIG. 16E is a conceptual diagram of a further example of a dual TS 312-segment packet. Referring to FIG. 16E, packet information together with the turbo stream and the normal stream are included in the dual TS. The packet information is recorded in an option field. In this case, the position of the option field may be designated and fixed so that the position of the option field and the position of the turbo stream may not overlap. In FIG. 16E, m indicates a possible length of the turbo stream (bytes).

Still referring to FIG. 16E, it is noted that a program clock reference (PCR) region is fixed to the $15^{th}$ segment. As such, each option field can be fixed to a portion not overlapping with the turbo stream.

By way of example, provided that 312 segments are divided by a unit of 52 segments, the position of the option field may be expressed as follows:

program clock reference (PCR) using 6 bytes: 52n+15, n=0
original program clock reference (OPCR) using 6 bytes: 52n+15, n=1
adaptation field extension length using 2 bytes: 52n+15, n=2
transport private data length using 5 bytes: 52n+15, n=3, 4 5
splice countdown using 1 byte: 52n+15, n=0, 1, 2, 3, 4, 5

Although it is not illustrated in FIG. 16E, it can be seen that "transport private data length" will be positioned in the 171, 223 and $275^{th}$ segments, according to the above expressions.

Other than the structures shown in FIGS. 16A through 16E, variously constructing the dual TS packet, in which the turbo stream is inserted in the null data, is possible while also excluding the option field of the AF. Additionally, the rate of the turbo stream may adjusted depending on the structure of the dual TS packet.

FIG. 17 is a block diagram of a digital broadcasting transmission system having supplementary reference signal (SRS) according to still another embodiment of the present invention. The digital broadcasting transmission system of FIG. 17, includes a TS generator 1101, a randomizer 1103, an SRS inserter 1105, a parity region generator 1107, a first interleaver 1109, a turbo processor 1111, a deinterleaver 1113, an RS encoder 1115, a second interleaver 1117, a trellis/parity corrector 1119, a MUX 1121, and a modulator 1123.

The TS generator 1101 constructs a dual TS packet by receiving a normal steam and a turbo stream. In doing so, the TS generator 1101 generates a stuffing region to insert SRS data to each packet of the dual TS stream. The SRS is a signal pattern known to both the transmission side and the reception side in common. The reception side checks the channel status and determines the compensation degree by comparing the SRS in the received stream with the known SRS.

The stuffing region is a region generated in a part of a packet comprising a header and a payload, for the SRS insertion. In more detail, the packet further includes an AF. Part or all of the AF may be used as the stuffing region. In this situation, the AF of the packet may additionally include a stuffing region in which data is inserted for the sake of the initialization of the trellis/parity corrector 1119.

The AF may include an option field where diverse packet information is recorded. The option field is a program clock reference (PCR) used for the synchronization of a demodulator of the receiver, an original program clock reference (OPCR) used in program recording, timer-recording, and playback at the receiver, four circuit blocks, splice countdown which is the number of succession of macroblocks comprising a Cr, Cb block respectively, a transport private data length which is the length of text data for teletext, and an adaptation field extension length. According to an embodiment of the invention, the stuffing region and the option field are arranged not to overlap.

Since the TS generator 1101 may be constructed as in FIGS. 5A, 5B, 5C and 8, further descriptions thereof will be omitted for brevity. Where the TS generator 1101 has a RS encoder 310 as shown in FIGS. 5B, 5C and 8, the RS encoder may be referred to as a first RS encoder 310 to discriminate from the RS encoder 1115 of FIG. 17 and the RS encoder 1115 of FIG. 17 may be referred to as a second RS encoder 1115.

The randomizer 1103 randomizes the dual TS including the stuffing region. The SRS inserter 1105 inserts an SRS to the stuffing region in the randomized dual TS. The SRS may be adopted for the synchronization and/or the channel equalization at the reception side. The parity region generator 1107 generates a first parity insertion region for inserting parity bits for the error correction into the dual TS packet having the inserted SRS. The first interleaver 1109 interleaves the dual TS packet having the first parity insertion region generated. The turbo processor 1111 convolutionally encodes the turbo stream included in the interleaved packet, and interleaves the convolutionally encoded turbo stream. The turbo processor 1111 may be implemented as shown in FIG. 10. The deinterleaver 1113 deinterleaves the packet output from the turbo processor 1111. The RS encoder 1115 encodes the deinterleaved dual TS packet. More specifically, the RS encoder 1115 is constructed as a concatenated code, to insert the parity bits for error correction into the first parity insertion region of the packet having the inserted SRS. The second interleaver 1117 interleaves the dual TS packet having the inserted parity. The trellis/parity corrector 1119 trellis-encodes the packet interleaved by the second interleaver 1117, and corrects the parity bits.

Figure 18:
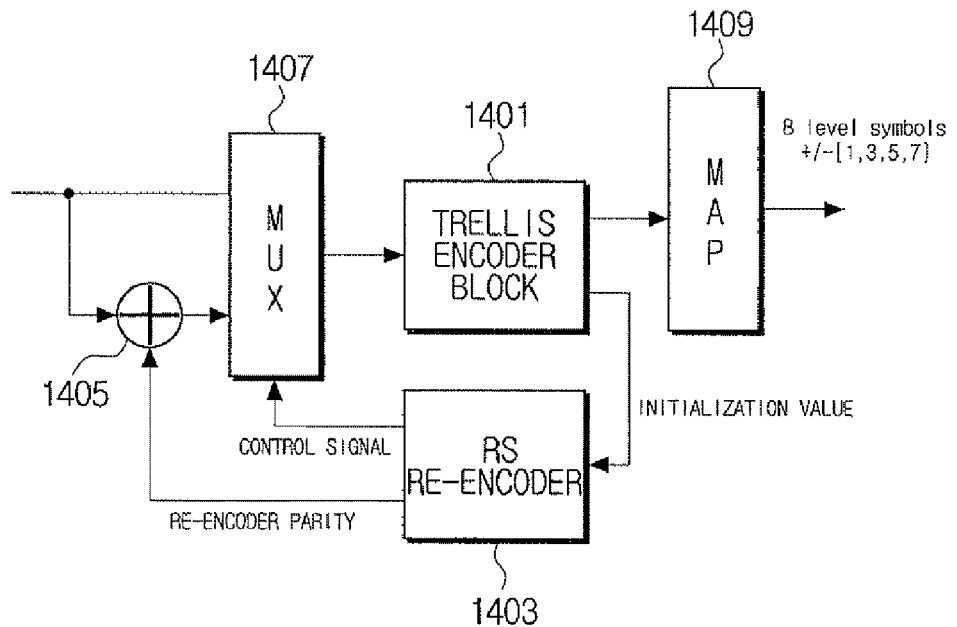
FIG. 18 is a block diagram of a trellis/parity corrector.

FIG. 18 is a block diagram of the trellis/parity corrector 1119 which is applied to the digital broadcasting transmission system of FIG. 17. Referring to FIG. 18, the trellis/parity corrector 1119 includes a trellis encoder block 1401, an RS re-encoder 1403, an adder, 1405, a MUX 1407, and a MAP 1409.

The MUX 1407 may have an operational mode for trellis-encoding the packet interleaved by the second interleaver 1117 (hereinafter, referred to as "a normal mode"), and an operational mode for trellis-encoding the packet added by the adder 1405 (hereinafter, referred to as "a parity correction mode"). The operational mode of the MUX 1407 is determined by a control signal received from the RS re-encoder 1403.

The trellis encoder block 1401 trellis-encodes the packet received from the MUX 1407. The trellis encoder block 1401 is capable of trellis-encoding the packet according to an external control signal. According to an embodiment of the invention, the trellis encoder block 1401 is initialized just prior to the trellis-encoding of the SRS data of the packet.

The RS re-encoder 1403 regenerates the parity corresponding to the changed packet during the initialization of the trellis encoder block 1401.

The adder (exclusive OR) 1405 adds the re-encoded parity and the packet fed from the second interleaver 1117, and provides the re-encoded parity and the packet to the MUX 1407. The addition operation is as follows:

A) omitted . . . 10100101011001010101011AAAAA . . . omitted

B) omitted . . . 000000000000010000000000BBBBB . . . omitted

C) omitted . . . 10100101011011010101011CCCCC . . . omitted

A) shows the packet that is received from the second interleaver 1117, B) shows the RS re-encoded packet, and C) shows the result of the exclusive OR of A) and B) using the adder 1405. When the underlined part in the A) is input to the trellis encoder block 1401, the initialization is conducted. At this time, a value corresponding to a pre-stored value in the trellis encoder block 1401 is provided to the RS re-encoder 1403. The RS re-encoder 1403 outputs the packet B) by adding the parity to the provided value. The underlined part in the packet B) implies a changed value corresponding to the underlined part of the packet A). It is noted that the parity bits corresponding to the underlined part in the packet B) is regenerated to BBBBB.

The adder 1405 then outputs the packet C) by performing the exclusive OR to the packet A) and the packet B). As one can see, in the packet C), the underlined part in the packet A) initially input is changed to "01" and the pity is also changed from AAAAA to CCCCC.

The MUX 1407 operates in the normal operational mode when the initialization and the parity correction are completed, and provides the dual TS to the trellis encoder block 1401.

The MAP 1409 performs the symbol mapping to 8 levels with respect to the trellis-encoded packet, and outputs the mapped packet.

Figure 19:
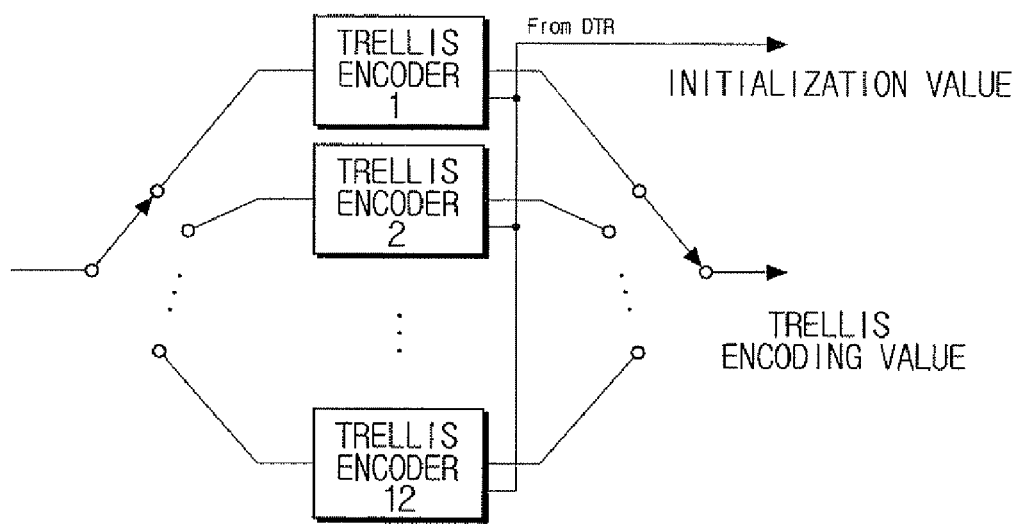
FIG. 19 is a block diagram of a trellis encoder block.

FIG. 19 is a block diagram of the trellis encoder block 1401 applied to the digital broadcasting transmission system of FIG. 17. The trellis encoder block 1401 of FIG. 19 includes twelve trellis encoders 1 through 12. Accordingly, the trellis encoders 1 through 12 are consecutively selected in order according to the received packet, and each outputs its respective trellis value. As mentioned earlier, during the initialization period, a value corresponding to the pre-stored value in a register (not shown) of the trellis encoder is provided to the RS re-encoder 1403 as the initialization value.

Figure 20:
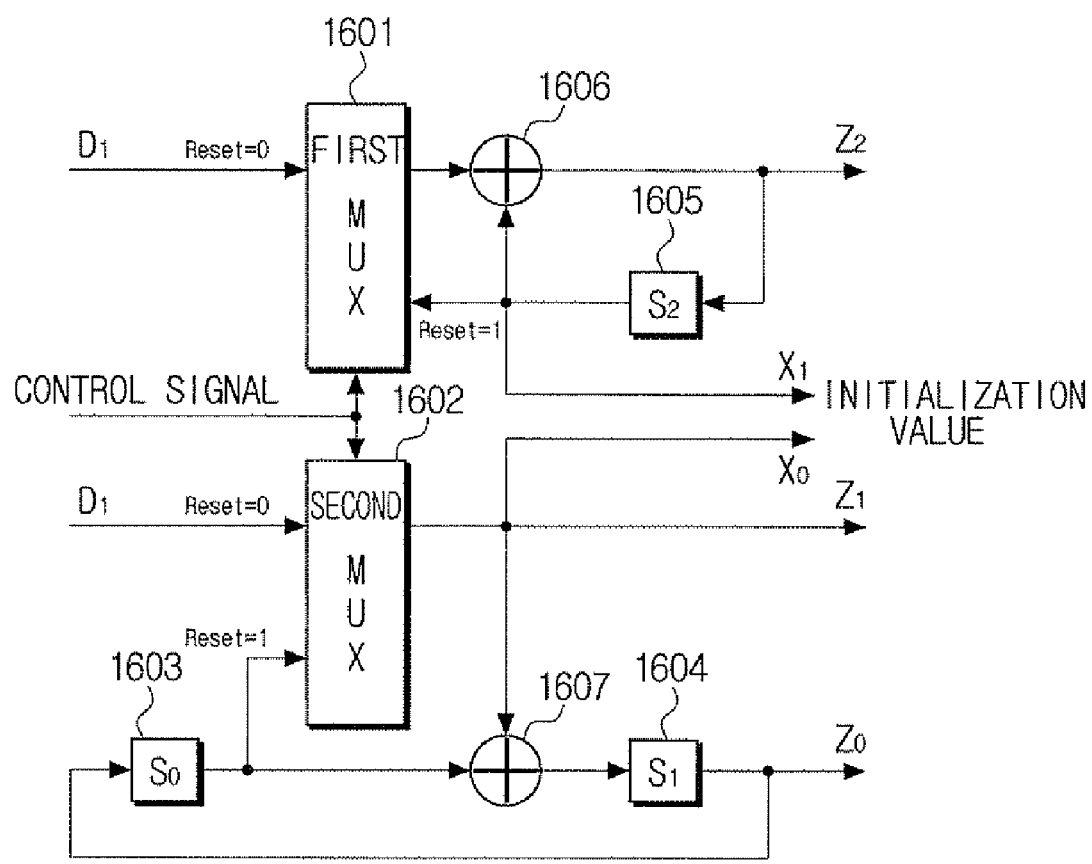
FIG. 20 is a block diagram of a trellis encoder.

FIG. 20 is a block diagram of a trellis encoder employed in the trellis encoder block 1401 of FIG. 19. The trellis encoder of FIG. 20 includes two MUXs 1601 and 1601, three memories 1603, 1604 and 1605, and two adders 1606 and 1607.

The trellis encoder carries out the initialization just before the trellis encoding of the SRS in the interleaved dual TS. In detail, upon receiving the stream corresponding to the stuffing region generated in the AF for the initialization, the trellis encoder performs the initialization process. When the initialization period is opened, a control signal is fed to the first and second MUXs 1601 and 1602. The first MUX 1601 selects either the value stored in the S2 memory 1605 or D1 depending on the control signal and outputs the selected one to the first adder 1606. The second MUX 1602 selects either the value stored in the S0 memory 1603 or D0 depending on the control signal and outputs the selected one to the second adder 1607.

When the control signal 1 is input, the first MUX 1601 selects and outputs the stored value of the S2 memory 1605 to the first adder 1606. The first adder 1606 adds the output value of the first MUX 1601 with the stored value of the S2 memory 1605. The resultant value is output as Z2 and is stored in the S2 memory 1605 at the same time. Since the two inputs to the first adder 1606 are the same, the output value of the first adder 1606 is always zero. Thus, a zero (0) is stored in the S2 memory 1605 to initialize.

As such, the input value D1 is replaced by the stored value of the S2 memory 1605. Accordingly, the parity bits assigned to the dual TS including the input value D1 is incorrect. To compensate for the incorrect parity bits, the existing value stored in the S2 memory 1605 is output as the initialization value X1 and is provided to the RS re-encoder 1403.

The second MUX 1602 selects and outputs the stored value of the S0 memory 1603 when the control signal is 1. The output value of the second MUX 1602 is output as Z1 and provided to the second adder 1607 at the same time. The output value of the second MUX 1602 is output as the initialization value X as well. The value stored in the S0 memory 1603 is fed directly to the second adder 1607. Hence, the second adder 1607 adds two same values and outputs 0. Simultaneously, the existing value stored in the S1 memory 1604 is shifted to the S0 memory 1603. The existing value stored in the S1 memory 1604 is output as Z0.

When the control signal 1 is input again, since the value stored in the S1 memory 1604, that is, a 0 is shifted to the S0 memory 1603, the S0 memory 1603 is also initialized. Simultaneously, the second MUX 1602 outputs the current value stored in the S0 memory 1603, that is, the value stored in the S1 memory 1604 prior to the initialization, is output as X0 value. The X0 value is also provided to the RS re-encoder 1403 together with the X1 value.

As for the non-initialization period, a control signal 0 is input to the first and second MUXs 1601 and 1602. Hence, as D0 and D1 are respectively selected, the trellis encoding proceeds.

The control signal 0 or 1 is received from a control signal generator (not shown) that is separately equipped.

As is described, when the initialization proceeds, each trellis encoder outputs the value corresponding to the internal memory value being pre-stored, as the initialization value.

In the meantime, two memories S0 1603 and S1 1604 are disposed at the second MUX 1602, control signal 2 symbols are required to initialize the memories S0 1603 and S1 1604. There are eight initialization states (000, 111, 001, 010, 100, 110, 101, 011) that are generated using all of the three memories S0 1603, S1 1604 and S2 1605. X0 and X1 values corresponding to each initialization state are provided to the RS re-encoder 1403, respectively, to change the parity bits. The operation of the RS re-encoder 1403 has been explained earlier.

The resetting process of the trellis encoder of FIG. 20 is specified based on the following table.

TABLE 1

| Reset at $t=0$ | (S0, S1, S2), (X0, X1) at $t=0$ | (S0, S1, S2), (X0, X1) at $t=1$ | (S0, S1, S2) Next Stage at $t=2$ | Output Z2 Z1 Z0 |
|---|---|---|---|---|
| 1 | (0, 0, 0), (0, 0) | (0, 0, 0), (0, 0) | (0, 0, 0) | 000 |
| 1 | (0, 0, 1), (0, 1) | (0, 0, 0), (0, 0) | (0, 0, 0) | 000 |
| 1 | (0, 1, 0), (0, 0) | (1, 0, 0), (1, 0) | (0, 0, 0) | 000 |
| 1 | (0, 1, 1), (0, 1) | (1, 0, 0), (1, 0) | (0, 0, 0) | 000 |
| 1 | (1, 0, 0), (1, 0) | (0, 0, 0), (0, 0) | (0, 0, 0) | 000 |
| 1 | (1, 0, 1), (1, 1) | (0, 0, 0), (0, 0) | (0, 0, 0) | 000 |
| 1 | (1, 1, 0), (1, 0) | (1, 0, 0), (1, 0) | (0, 0, 0) | 000 |
| 1 | (1, 1, 1), (1, 1) | (1, 0, 0), (1, 0) | (0, 0, 0) | 000 |

In Table 1, the initialization commences when the control signal, that is, the reset signal becomes 1 at t=0, and all of S0, S1 and S2 become 0 after t=2. As such, the initialization is completed during the two-symbol clock period.

FIGS. 21A through 21E are conceptual diagrams to illustrate various structures of a dual TS having the SRS according to an embodiment of the present invention. As shown in FIG. 21A, the packet A is a turbo stream packet received at the TS generator 1101, the packet B is a normal stream packet having stuffing regions the SRS data and the turbo stream are inserted, and the packet C is a dual TS packet having the SRS and the turbo stream inserted therein in the stuffing regions. In the packet A, the turbo stream packet of 188 bytes comprises a 1-byte SYNC as the header, a 3-byte PID, and a 184-byte turbo data.

In packet B, the normal stream packet of 188 bytes comprises a 1-byte SYNC as the header, a 3-byte PID, a 2-byte AF header which is the AF, an S-bytes stuffing region for the SRS insertion, an N-bytes stuffing region for the turbo data insertion, and a 182-S-N-byte normal data as the payload.

The packet C is constructed such that SRS data is inserted in the stuffing region S and such that part of the turbo stream packet is inserted in the stuffing region N of the packet B. As for the packet C, the dual TS packet of 188 bytes comprises a 1-byte SYNC as the header, a 3-byte PID, a 2-byte AF header which is the AF, an S-byte SRS data, an N-byte turbo data, and a 182-S-N-byte normal data being the payload.

FIG. 21B shows another exemplary dual TS stream. In the dual TS of FIG. 21B, the turbo stream 78 packets are inserted in the packet of 312 segments of the dual TS 1 field. The dual TS is constructed by repeating 4 packets in which one turbo stream packet (188 bytes) and three normal stream packets (188 bytes) are arranged in a 1:3 ratio. Where the turbo stream 70 packets are inserted in the 312 segments of the dual TS, the dual TS is constructed by repeating 4 packets in which one turbo stream packet (188 bytes) and three normal packets (188 bytes) are arranged in the 1:3 ratio 70 times, and arranging 32 packets with the normal stream packets.

FIG. 21C shows still another example of the dual TS. In the dual TS of FIG. 21C, the turbo stream 88 packets are inserted in a packet of 312 segments of the dual Ts 1 field. The dual TS is constructed by repeatedly arranging four packets in which the turbo stream 2 packets (188 bytes) and the normal stream 2 packets (188 bytes) are arranged four times, and four packets in which the turbo stream 1 packet (188 bytes) and the normal stream 3 packets (188 bytes) are arranged in the ratio of 1:3 as shown in FIG. 21B.

FIG. 21D shows yet another example of the dual TS. The dual TS of FIG. 21D is a combination of the packet C of FIG. 21A and that of the FIG. 21B. The dual TS of FIG. 21D is constructed by repeatedly arranging four packets in which the turbo stream 1 packet (188 bytes), the normal stream 1 packet having SRS data and turbo data inserted in part of the AD field, and the normal stream 2 packets are each positioned.

FIG. 21E is a conceptual diagram illustrating only 52-segments packet of the dual TS multiplexed as in the packet C of FIG. 21A. In FIG. 21E, it is noted that the turbo data, that is, the turbo stream, is inserted after the SRS data. A tunneling data channel (TDC) is an empty region to be used by the user, if necessary. The TDC may occupy 6 bytes in the stuffing region at a maximum. The TDC may be positioned at the front end in the stuffing region where the SRS is recorded, or between the SRS data.

Provided that 312 segments are divided by 52 segments, the position of the option field may be expressed as follows:

PCR using 6 bytes: 52n+15, n=0
OPCR using 6 bytes: 52n+15, n=1
adaptation field extension length using 2 bytes: 52n+15, n=2
transport private data length using 5 bytes: 52n+15, n=3, 4, 5
splice countdown using 1 byte: 52n+15, n=0, 1, 2, 3, 4, 5

By way of example, the PCR denotes that there is a PCR at the position at n=0.

The dual TS packet having the SRS data inserted in the stuffing region excluding the option field of the AF may be constructed in various manners. The rate of the turbo data is adjustable according to the structure of the dual TS packet.

Figure 22:
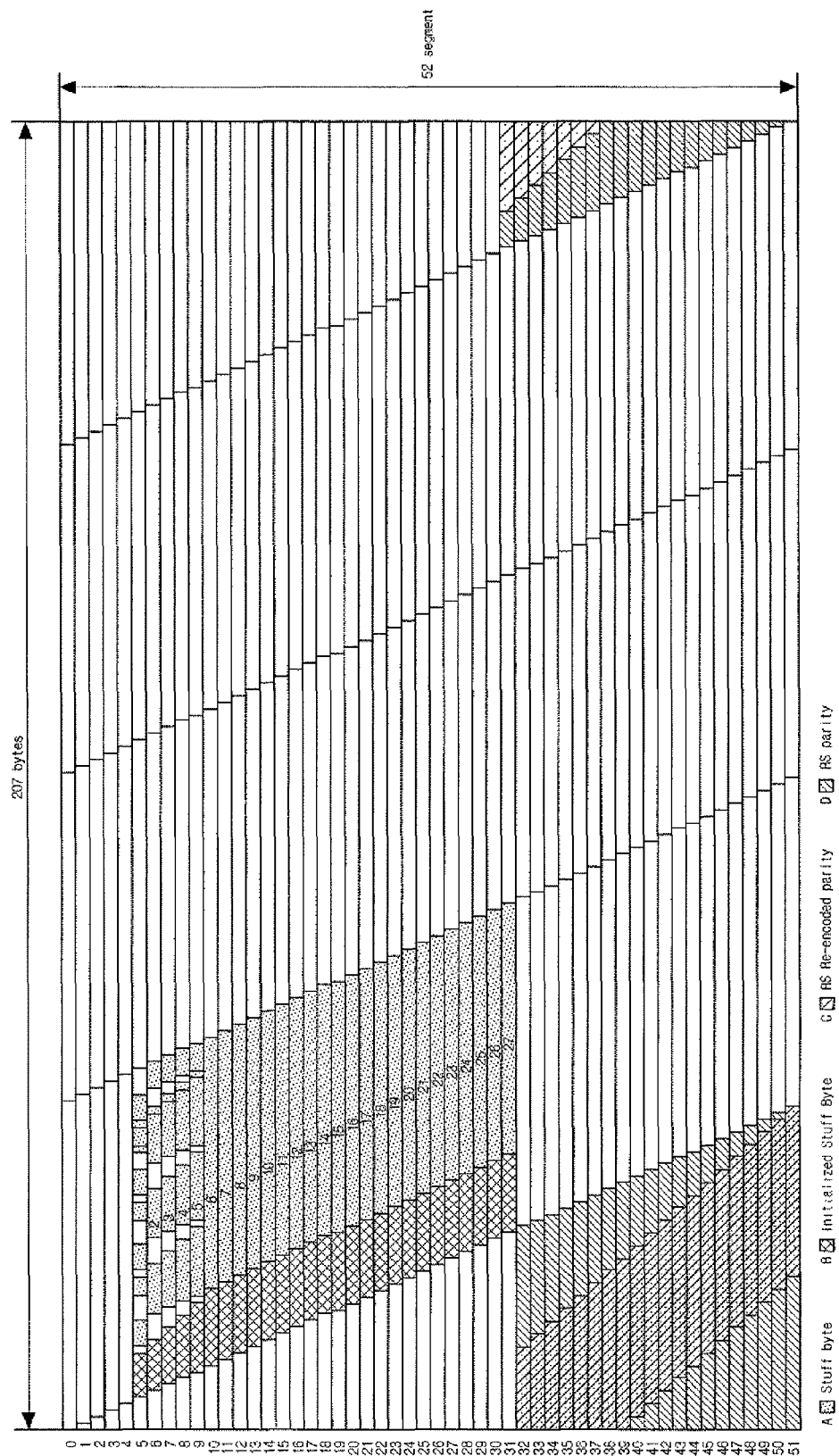
FIG. 22 is a conceptual diagram for illustrating an interleaving mode of the dual TS.

FIG. 22 is a conceptual diagram to illustrate a stream structure interleaved by the second interleaver 1117. In FIG. 22, A, which is the stuff byte, indicates the SRS 1 through 27. B, which is the initialized stuff byte, indicates the region for initializing the trellis/parity corrector 1119. C, which is the RS re-encoded parity region, indicates the region where the parity region corresponding to the packet changed by the initialization of the trellis encoder is replaced with the regenerated parity region. D, which is the RS parity region, indicates the parity region generated by the RS encoding.

Figure 23:
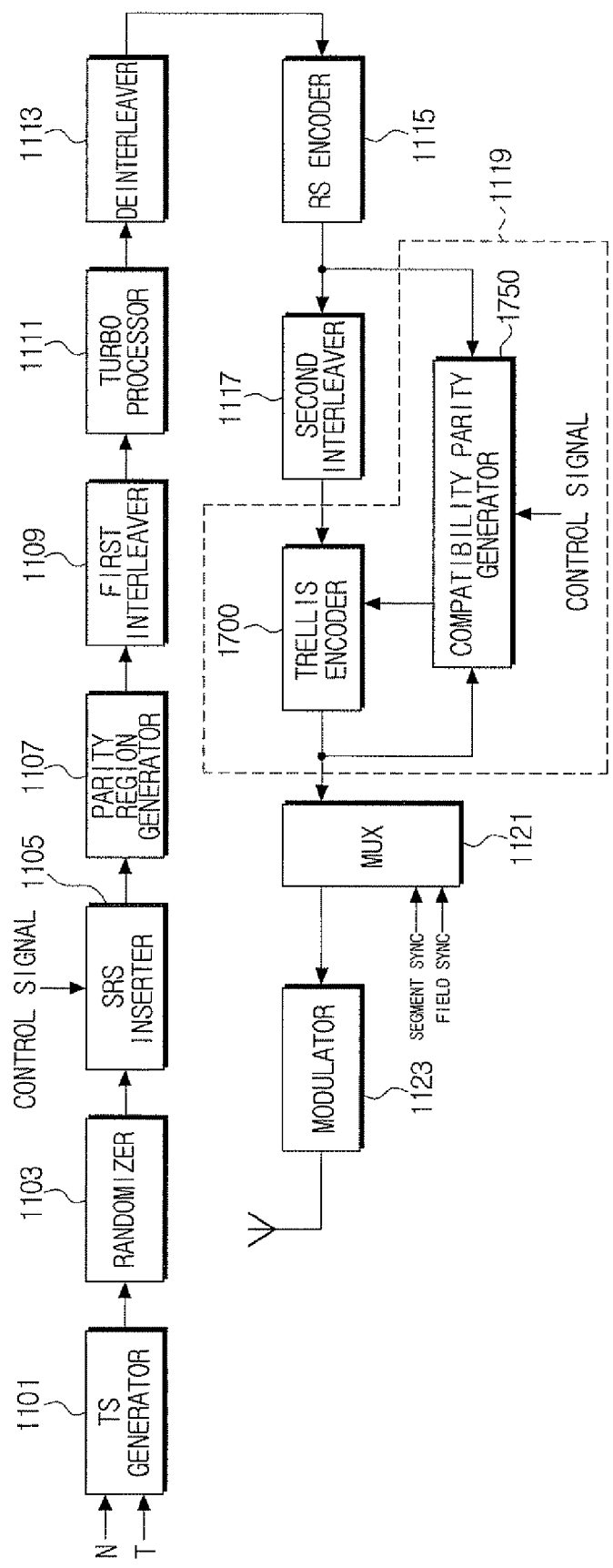
FIG. 23 is a block diagram of a digital broadcasting transmission system according to yet another embodiment of the present invention.

FIG. 23 is a block diagram of a digital broadcasting transmission system according to yet another embodiment of the present invention, which outputs the dual TS having the inserted SRS. As shown in FIG. 23, the digital broadcasting transmission system is implemented such that a trellis-parity corrector 1119 includes a trellis encoder 1700 and a compatibility parity generator 1750.

The trellis encoder 1700 trellis-encodes the dual TS interleaved by a second interleaver 1117. At this time, the trellis encoder 1700 performs the initialization just before the trellis encoding of the SRS data.

The trellis encoder 1700 operates in one of a normal mode to trellis-encode the interleaved packet, an initialization mode to initialize the trellis encoder 1700, and a parity exchange mode to allow for an inserting of the replaced compatibility parity instead of part of all of the parity added by a RS encoder 1115. While operating in the normal mode, when a control signal instructing the initialization mode is received, the trellis encoder 1700 operates in the initialization mode. When receiving a control signal instructing the parity exchange mode, the trellis encoder 1700 operates in the parity exchange mode. The operation mode may be determined according to the control signal fed from a control signal generator (not shown). To do this, the control signal generator (not shown) needs to be aware of a position where the SRS data is inserted, a position of a value inserted for the initialization of the trellis encoder 1700, and a position to be able to change the compatibility parity, in advance.

A compatibility parity generator 1750 receives the packet having the parity added by the second RS encoder 1115 and the packet encoded by the trellis encoder 1700, generates a compatibility parity based on the received packets, and provides the generated compatibility parity to the trellis encoder 1700. The trellis encoder 1700 compensates the parity by inserting the compatibility parity to the dual TS.

A MUX 1121 multiplexes the trellis-encoded packet by adding a segment sync signal and a field sync signal. A modulator 1123 conducts channel modulation with respect to the packet having the added segment sync and field sync signals, up-converts to a signal of the RF channel band, and transmits the up-converted signal to an external device. FIG. 24 is a block diagram of the compatibility parity generator 1750 applied to the digital broadcasting transmission system of FIG. 23. In FIG. 24, the compatibility parity generator 1750 includes a symbol deinterleaver 2901, a deinterleaver 2903, a storage 2905, a RS encoder 2907, an interleaver 2909, and a symbol interleaver 2911.

The symbol deinterleaver 2901 receives the packet encoded by the trellis encoder 1700 and performs the symbol interleaving to the symbol-mapped packet by the byte. The deinterleaver 2903 deinterleaves the symbol-deinterleaved packet.

The storage 2905 receives the packet encoded by the RS encoder 1115, replaces at least part of the received packet with the packet, having been deinterleaved at the deinterleaver 2903, and then stores the replaced packet. The storage 2905 may store the packet by replacing only a different part of the encoded packet and the deinterleaved packet. The storage 2905 may be controlled by a control signal received from the control signal generator.

The RS encoder 2907 adds the compatibility parity to the stored packet. The interleaver 2909 interleaves the packet having the added compatibility parity. The symbol interleaver 2911 interleaves the symbols of the byte-wise packet being interleaved and provides the symbol-interleaved packet to the trellis encoder 1700.

FIG. 25 is a block diagram of a digital broadcasting transmission system according to a further embodiment of the present invention. The digital broadcasting transmissions system of FIG. 25 includes a TS generator 500, a randomizer 410, an SRS generator 415, an RS encoder 420, an interleaver 430, a turbo processor 440, a trellis/parity corrector 450, a MUX 460, a pilot inserter 470, a pre-equalizer 480, a VSB modulator 490, and an RF modulator 495. In the digital broadcasting system of FIG. 25, the SRS generator 1805 is added to the digital broadcasting transmission system of FIG. 14. Accordingly, the dual TS including the SRS signal, the normal stream, and the turbo stream are transmitted through the transmission system of the more simplified structure.

When the TS generator 500 constructs the dual TS including the stuffing region, the normal stream and the turbo stream, the randomizer 410 randomizes the dual TS and provides the randomized dual TS to the SRS generator 415. The SRS generator 415 inserts the SRS signal to the whole or part of the stuffing region in the randomized dual TS.

The RS encoder 420 encodes the dual TS having the inserted SRS, and the interleaver 430 interleaves the encoded dual TS.

The turbo processor 440 convolutionally encodes the turbo stream in the interleaved dual TS and then interleaves the convolutionally encoded turbo stream. Next, the turbo processor 440 reconstructs the dual TS by inserting the interleaved turbo stream to the dual TS again.

The dual TS reconstructed at the turbo processor 440 is trellis-encoded by the trellis/parity corrector 450. The trellis/parity corrector 450 proceeds the initialization prior to the SRS encoding and compensates for the parity according to the value changed by the initialization. Specifically, the trellis/parity corrector 450 may be implemented as in FIG. 18. Since the operation of the trellis/parity corrector 450 has been described in detail in reference to FIGS. 17 and 18, further descriptions thereof will be omitted.

The trellis-encoded dual TS is multiplexed with the segment sync signal and the field sync signal by the MUX 460. Operations of the pilot inserter 470, the pre-equalizer 480, the VSB modulator 490, and the RF modulator 495 are the same as those in the FIG. 14, and their detailed description will be omitted.

FIG. 26 is a block diagram of a digital broadcasting reception system according to one embodiment of the present invention. Referring to FIG. 26, the digital broadcasting reception system includes a demodulator 1901, an equalizer 1903, a first processor 1900, and a second processor 1950. The demodulator 1901 detects the synchronization according to the sync signals added to the baseband signal of the received dual TS, and conducts the demodulation. The equalizer 1903 removes the interference of the received symbol by equalizing the demodulated dual TS and compensates for the channel distortion due to the channel multipath. The first processor 1900 includes a viterbi decoder 1905, a first deinterleaver 1907, a first RS decoder 1909, and a first derandomizer 1911.

The viterbi decoder 1905 corrects errors in the normal stream of the equalized dual TS, decodes the error-corrected symbol, and outputs the symbol packet. The decoded packet rearranges the packet spread by the first deinterleaver 1915.

Error in the deinterleaved packet is corrected through the first RS decoder 1909, and the corrected packet is derandomized by the first derandomizer 1911. Therefore, the normal stream of the dual TS is restored.

The second processor 1950 includes a turbo decoder 1913, a second deinterleaver 1915, a parity eliminator 1917, a second derandomizer 1919, and a turbo DE-MUX 1921.

The turbo decoder 1913 turbo-decodes the turbo stream in the equalized dual TS. At this time, the turbo decoder 1913 detects only the turbo stream by demultiplexing the dual TS. The normal stream separated through the demultiplexing be multiplexed with the normal stream output from the viterbi decoder 1905 by a MUX (not shown) which is separately provided.

Herein, the turbo decoding implies the trellis encoding with respect to the turbo stream of the equalized dual TS.

The second deinterleaver 1915 deinterleaves the turbo-decoded turbo stream.

The parity eliminator 1917 eliminates the parity added to the deinterleaved turbo stream.

The second derandomizer 1919 derandomizes the turbo stream from which the parity is eliminated.

The turbo DE-MUX 1921 restores the turbo data by demultiplexing the derandomized turbo stream.

Figure 27:
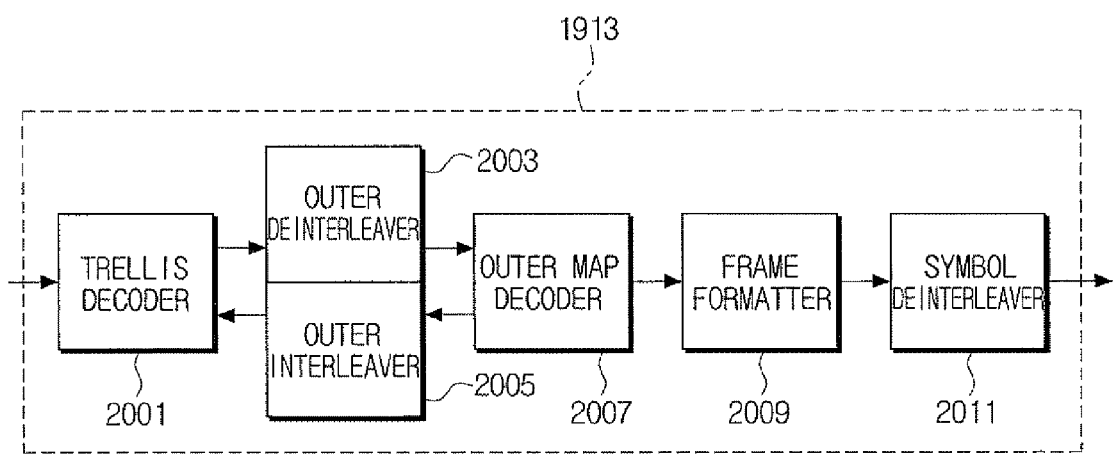
FIG. 27 is a block diagram of a turbo decoder.

FIG. 27 is a block diagram of the turbo decoder 1913. The turbo decoder 1913 of FIG. 27 includes a trellis decoder 2001, an outer deinterleaver 2003, an outer interleaver 2005, an outer MAP decoder 2007, a frame formatter 2009, and a symbol deinterleaver 2011. The trellis decoder 2001 trellis-decodes the turbo stream in the equalized dual TS and provides the trellis-decoded turbo stream to the turbo deinterleaver 2003. The turbo deinterleaver 2003 deinterleaves the trellis-decoded turbo stream. The outer MAP decoder 2005 convolutionally decodes the deinterleaved turbo stream. The outer MAP decoder 2005 outputs soft decision or hard decision output values depending on the result of the convolution decoding. The soft decisions and the hard decisions are made according to the matrix of the turbo stream. For instance, when the metric of the turbo stream is 0.8, the soft decision value of 0.8 is output. When the metric of the turbo stream is 1, the hard decision value of 1 is output.

The soft decision output value of the outer MAP decoder 2005 is supplied to the frame formatter 2009. Here, the soft decision output value implies the existence turbo stream.

The frame formatter 2009 formats the soft decision turbo stream convolutionally decoded in accordance with the frame of the dual TS.

The symbol deinterleaver 2011 deinterleaves the frame-formatted turbo stream from the symbol to the byte. The interleaving from the symbol to the byte will not be further explained (refer to the table D5.2 of U.S.A. ATSC DTV Standard (A/53)). Note that the turbo decoder 1913 is operable without the symbol deinterleaver 2011.

When the soft decision is output from the outer MAP decoder 2005, the outer interleaver 2005 interleaves the turbo stream and provides the interleaved turbo stream to the trellis decoder 2001. The trellis decoder 2001 trellis-decodes the interleaved turbo stream again and provides the interleaved turbo stream to the deinterleaver 2003. The outer deinterleaver 2003 re-deinterleaves and provides the turbo stream to the outer MAP decoder 2007. The trellis decoder 2001, the outer deinterleaver 2003, and the outer interleaver 2005 may repeatedly operate until the soft decision is output. Therefore, the reliable decoding value may be acquired.

FIG. 28 is a block diagram of a digital broadcasting reception system according to another embodiment of the present invention. With reference to FIG. 28, it is noted that the erasure decoder 2100 is added into the second processor 1950 of the digital broadcasting reception system of FIG. 27.

Where the TS generator 300, 500 of the digital broadcasting transmission system includes the erasure encoder 350 as shown in FIG. 8, an erasure decoder 2100 may be added to the digital broadcasting reception system accordingly. Hence, after the erasure decoding is conducted for the noise removal, the turbo stream is restored. Since the other elements are the same as in FIG. 27, descriptions thereof will be omitted. Meanwhile, in the digital broadcasting reception system of FIGS. 26 and 28, the second processor 1950 may include a RS decoder (not shown) which RS-decodes the deinterleaved turbo stream.

Figure 29:
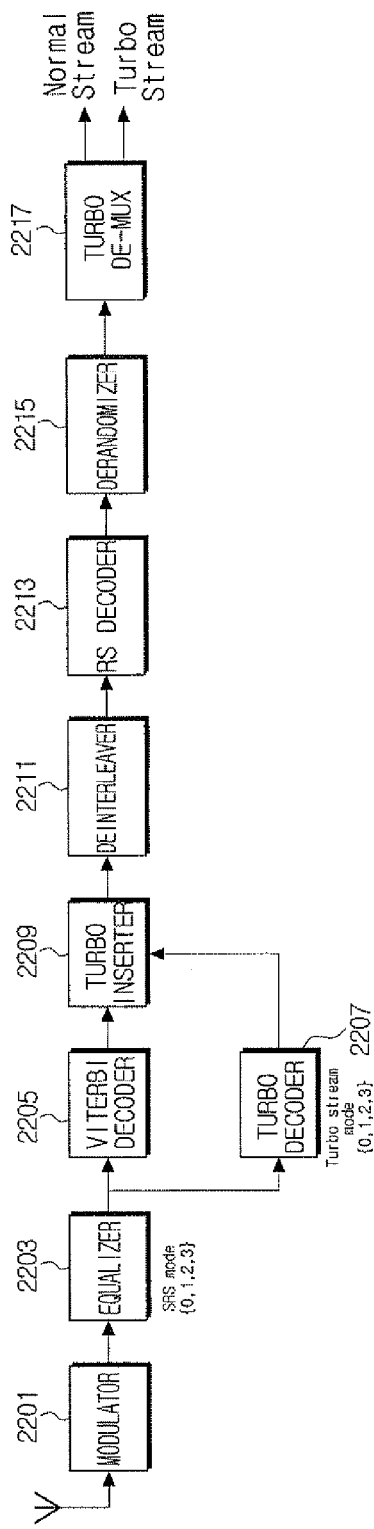
FIG. 29 is a block diagram of a digital broadcasting reception system according to still another embodiment of the present invention.

FIG. 29 is a block diagram of a digital broadcasting reception system according to still another embodiment of the present invention. In FIG. 29, the digital broadcasting reception system includes a demodulator 2201, an equalizer 2203, a viterbi decoder 2205, a turbo decoder 2207, a turbo inserter 2209, a deinterleaver 2211, a RS decoder 2213, a derandomizer 2215, and a turbo DE-MUX 2217.

The demodulator 2201 detects the synchronization according to the sync signals added to the baseband signal of the received dual TS, and performs the demodulation.

The equalizer 2203 compensates the channel distortion due to the channel multipath by equalizing the demodulated dual TS.

The viterbi decoder 2205 corrects error in the equalized dual TS and decodes the error-corrected symbol.

The turbo decoder 2207 turbo-decodes only the turbo stream of the equalized dual TS. The turbo decoder 2207 may be implemented as shown in FIG. 27, and will not be further explained.

The turbo inserter 2209 inserts the dual TS turbo-decoded by the turbo decoder 2207, into the viterbi-decoded dual TS.

In doing so, the turbo stream may be extracted from the turbo-decoded turbo TS and inserted into a region corresponding to the turbo stream of the viterbi-decoded dual TS. The region corresponding to the turbo stream may be a part of or the whole of the packet AF.

The deinterleaver 2211 deinterleaves the dual TS having the inserted turbo stream.

The RS decoder 2213 corrects errors by decoding the deinterleaved packet.

The derandomizer 2215 derandomizes the error-corrected packet. The turbo DE-MUX 2217 restores the normal stream and the turbo stream by demultiplexing the derandomized packet.

Figure 30A:
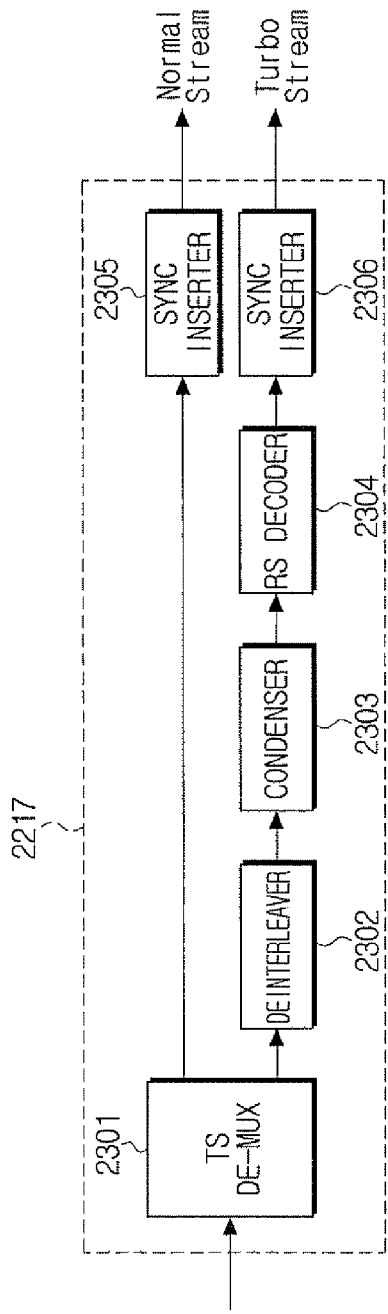
FIGS. 30A and 30B are block diagrams of various examples of a turbo DE-MUX.
Figure 30B:
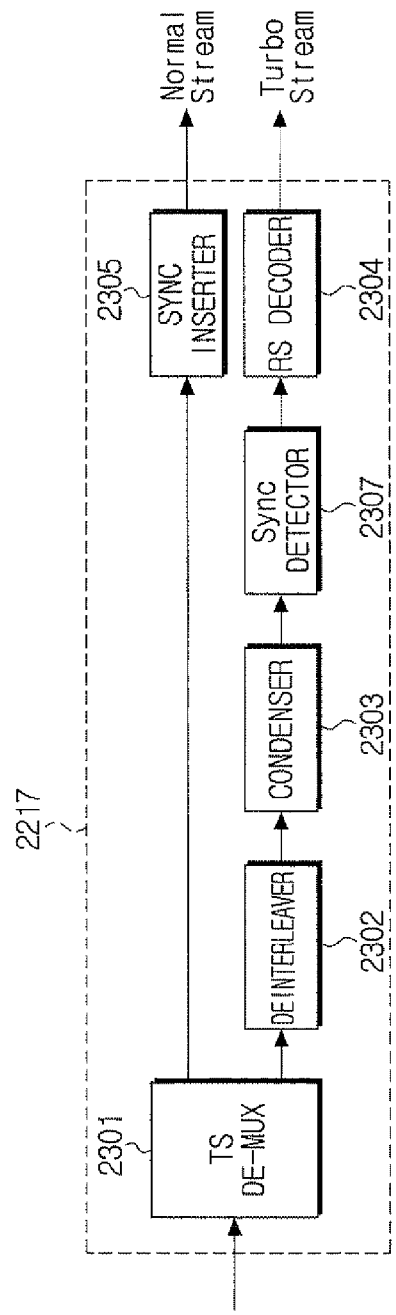

FIGS. 30A and 30B are block diagrams of the turbo DE-MUX 2217 according to embodiments of the present invention.

The turbo DE-MUX 2217 of FIG. 30A includes a TS DE-MUX 2301, a deinterleaver 2302, a condenser 2303, an RS decoder 2304, and first and second SYNC inserters 2305 and 2306.

The TS DE-MUX 2301 separates the normal stream and the turbo stream by demultiplexing the derandomized packet.

The normal stream, demultiplexed at the TS DE-MUX 2301, is restored to the normal stream of 188 bytes by an insertion of a sync signal by the first SYNC inserter 2305.

The deinterleaver 2302 deinterleaves the demultiplexed turbo stream.

The condenser 2303 removes an empty region (placeholder) in the deinterleaved turbo stream. The empty region is generated by the duplicator of the TS generator 300, 500 in the digital broadcasting transmission system, for insertion of the parity in the RS encoding. If the empty region is generated at ¼ or ½ rates, the turbo stream may be reduced by ¼ or ½ rates.

The RS decoder 2304 decodes the turbo stream from which the empty region is removed.

The second SYNC inserter 2306 restores the turbo stream of 188 bytes by an insertion of a sync signal (SYNC) to the decoded turbo stream. As explained earlier with reference to FIG. 6, when the sync signal of the turbo stream is eliminated in the generation of the dual TS, it is necessary to insert the sync signal at the second SYNC inserter 2306 to regenerating the turbo stream.

The turbo DE-MUX 2217 of FIG. 30B includes a TS DE-MUX 2301, a deinterleaver 2302, a condenser 2303, a RS decoder 2304, a first SYNC inserter 2305, and a SYNC detector 2307. As opposed to the embodiment of FIG. 6, the sync signal of the turbo stream may not be removed in the generation of the dual TS. In this situation, since the sync signal for the turbo stream is received with the normal stream, there is no need to insert the sync signal differently from FIG. 30A.

The SYNC detector 2307 receives the turbo stream from which the empty region is eliminated, checks the sync signal value 0x47 of the received turbo streams, and outputs 187 bytes after the sync signal to the RS decoder 2304. The sync signal value 0x47 represents the value of the sync signal in one packet, and one packet comprises 187 bytes, excluding the 1-byte sync signal, of the 188 bytes. Thus, it is preferred to detect from the sync signal value to the 187 bytes.

The RS decoder 2304 corrects errors of the 188-byte turbo stream from which the sync signal is detected, and then restores the turbo stream.

Figure 31:
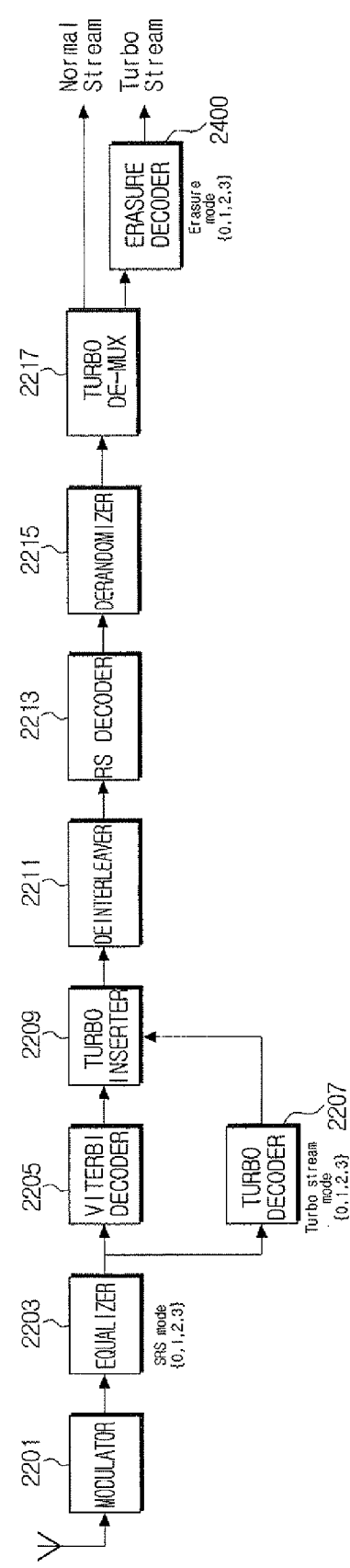
FIG. 31 is a block diagram of a digital broadcasting reception system according to yet another embodiment of the present invention.

FIG. 31 is a block diagram of a digital broadcasting reception system according to yet another embodiment of the present invention. It can be seen that the digital broadcasting reception system of FIG. 31 is constructed such that an erasure decoder 2400 is additionally added to the digital broadcasting reception system of FIG. 29.

Where the TS generator 300, 500 of the digital broadcasting transmission system is implemented including the erasure encoder 350 as shown in FIG. 8, an erasure decoder 2400 may be added to the digital broadcasting reception system accordingly. Hence, after the erasure decoding for the noise removal, the turbo stream is restored. Since the other elements are like with those in FIG. 29, descriptions thereof are omitted.

Figure 32:
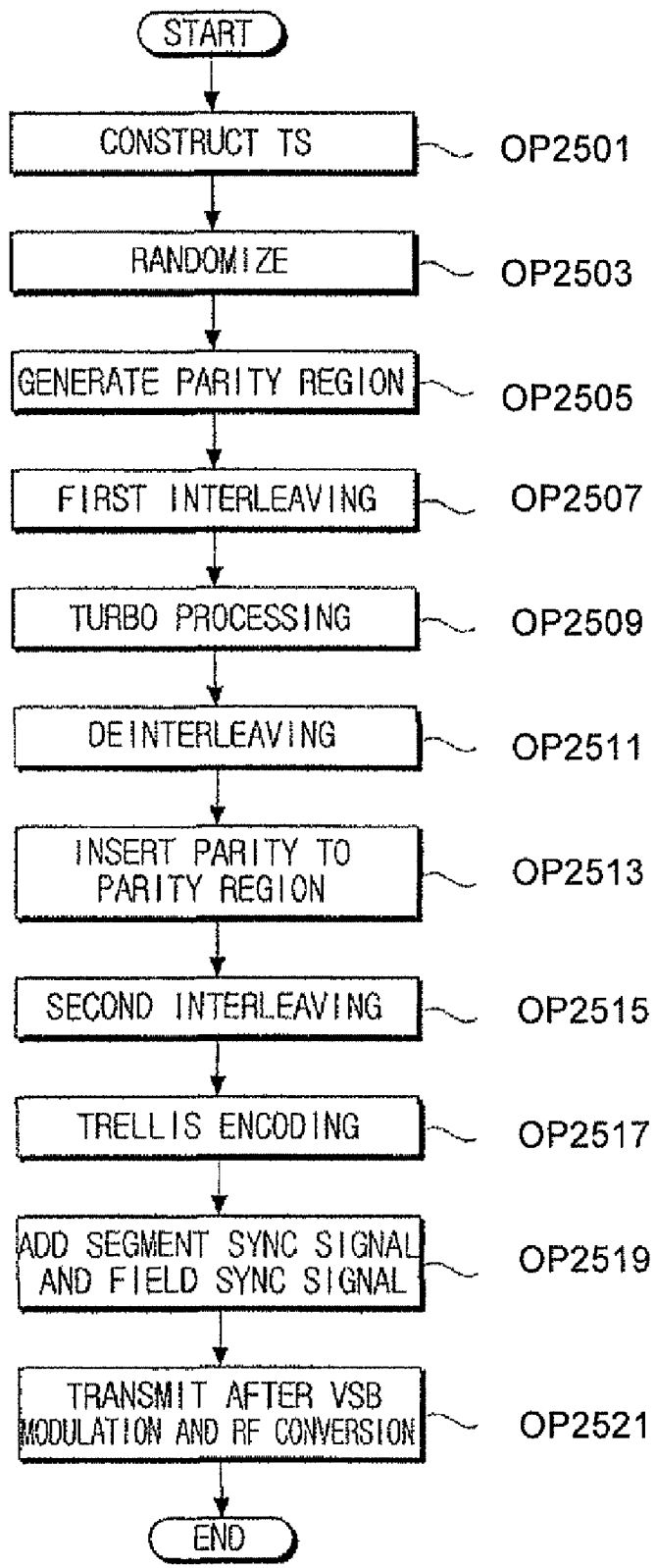
FIG. 32 is a flowchart for outlining a digital broadcasting transmission signal processing method according to one embodiment of the present invention.

FIG. 32 is a flowchart to outline a digital broadcasting signal transmission method according to one embodiment of the present invention. Referring to FIG. 32, first, the dual TS is constructed my multiplexing the normal stream and the turbo stream (op 2501). Specifically, when the turbo stream is received from an internal or external module, after the encoding and/or interleaving is carried out, a second parity insertion region for inserting the parity is generated. At this time, the erasure encoding for the turbo stream may be additionally performed.

Next, the dual TS having the second parity insertion region is randomized (op 2503).

A first parity insertion region for insertion of the parity is provided in the randomized dual TS for the error correction (op 2505), and the dual TS is interleaved (op 2507).

Next, the turbo processing is conducted to the turbo stream of the interleaved dual TS (op 2509).

After the turbo processing, the dual TS is encoded by inserting the first parity insertion region (op 2513), and interleaved (op 2515).

Next, the interleaved dual TS is trellis-encoded (op 2517). The trellis-encoded dual TS, the segment sync signal and the field sync signal are multiplexed (op 2519). After passing through the VSB modulation and the RF conversion, the dual TS is transmitted (op S2521).

Figure 33:
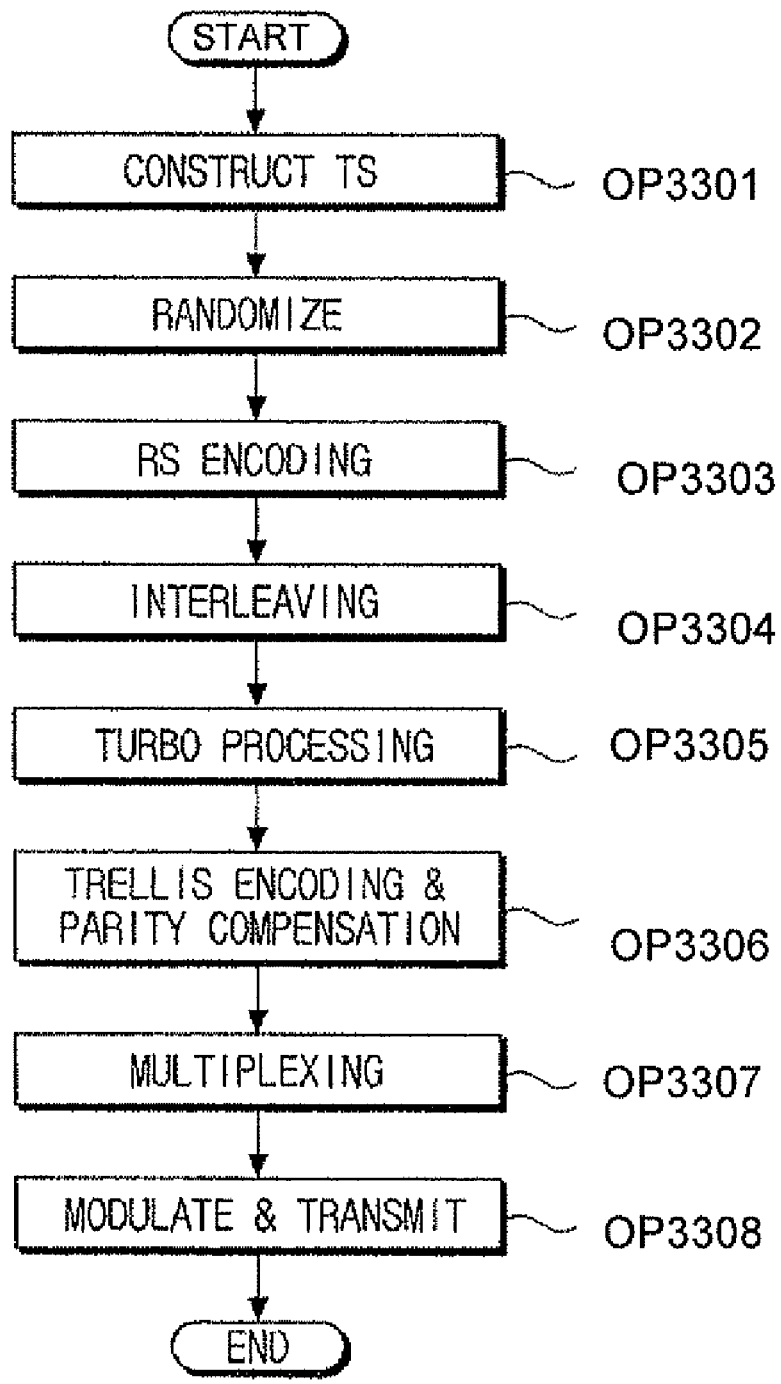
FIG. 33 is a flowchart for outlining a digital broadcasting transmission signal processing method according to another embodiment of the present invention.

FIG. 33 is a flowchart to outline a digital broadcasting transmission signal processing method according to another embodiment of the present invention. As shown in FIG. 33, the TS stream is constructed (op 3301), randomized (op 3302), and RS-encoded (op 3303).

Next, after interleaving the dual TS (op 3304), only the turbo stream passes through the turbo processing (op 3305). Since the turbo processing has been illustrated already, description thereof is omitted.

After the dual TS including the turbo-processed turbo stream is trellis-encoded, the parity error due to the turbo processing is compensated for (op 3306). The dual TS is multiplexed to add the sync signal (op 3307), modulated and transmitted (op 3308). As shown in FIG. 33, the digital broadcasting signal may be transmitted more simply than the digital broadcasting transmission signal processing method of FIG. 32.

Figure 34:
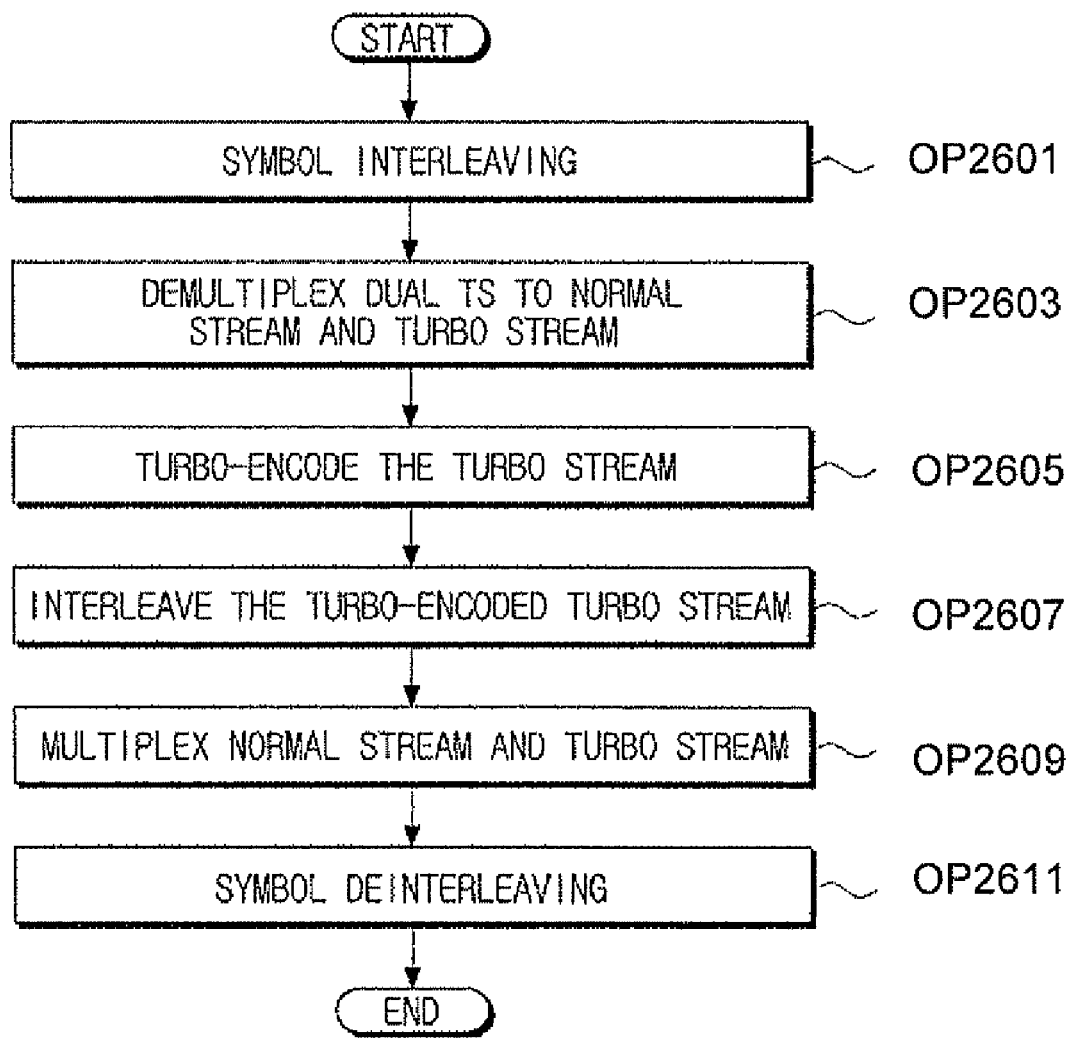
FIG. 34 is a flowchart for outlining a turbo stream processing method according to one embodiment of the present invention.

FIG. 34 is a flowchart to outline a turbo processing method according to one embodiment of the present invention. As shown in FIG. 34, after the dual TS is interleaved by the symbol (op 2601), the turbo stream is detected by demultiplexing the TS (op 2603).

Next, the dual TS is turbo-encoded by insertion of the parity in the second parity insertion region provided in the detected turbo stream (op 2605).

The encoded turbo stream is interleaved (op 2607), the dual TS is reconstructed by multiplexing the dual TS (op 2609). The reconstructed dual TS is deinterleaved by the symbol (op 2611). In doing so, the symbol interleaving (op 2601) and the symbol deinterleaving (op 2611) are omitted.

Figure 35:
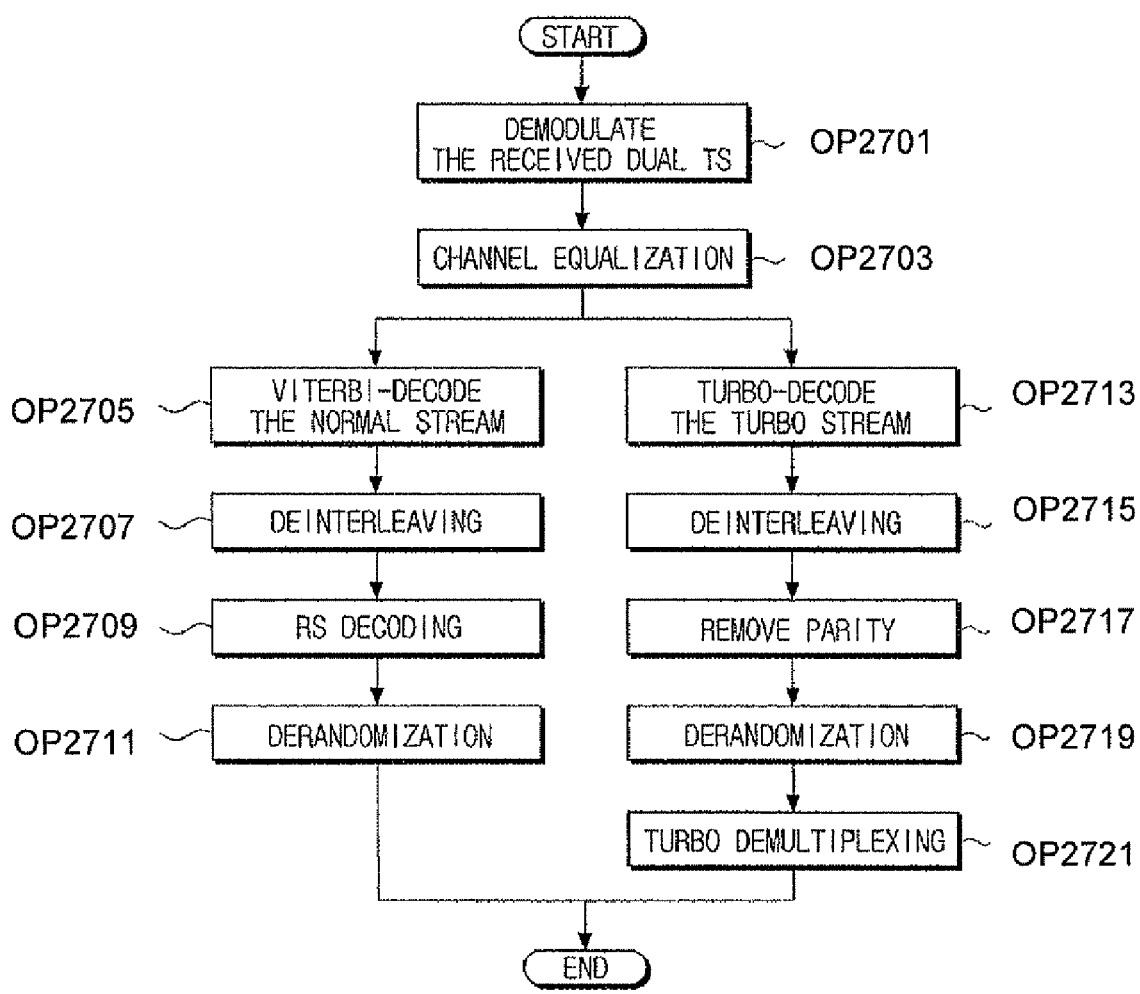
FIG. 35 is a flowchart for outlining a digital broadcasting reception signal processing method according to one embodiment of the present invention.

FIG. 35 is a flowchart to outline a digital broadcasting signal reception method according to one embodiment of the present invention. In FIG. 35, when the dual TS is received, the received dual TS is demodulated (op 2701) and passes through the channel equalization (op 2703).

Next, the normal stream and the turbo stream are separated and decoded, respectively.

In more detail, the normal stream is viterbi-decoded (op 2705), deinterleaved (op 2709), and RS-decoded (op 2709). Next, the normal stream packet is restored by derandomizing the RS-decoded normal stream (op 2711). The normal stream processing method may be carried out by using the existing reception system.

The turbo stream is turbo-decoded (op 2713). The turbo-decoded turbo stream is deinterleaved (op 2715). After removing the parity (op 2717), the turbo steam is derandomized (op 2719). Next, the turbo stream packet is restored by demultiplexing the derandomized turbo stream (op 2721).

Where the erasure encoding is carried out in the digital broadcasting signal transmission process, additionally conducting the erasure decoding of the restored turbo stream packet is possible.

Figure 36:
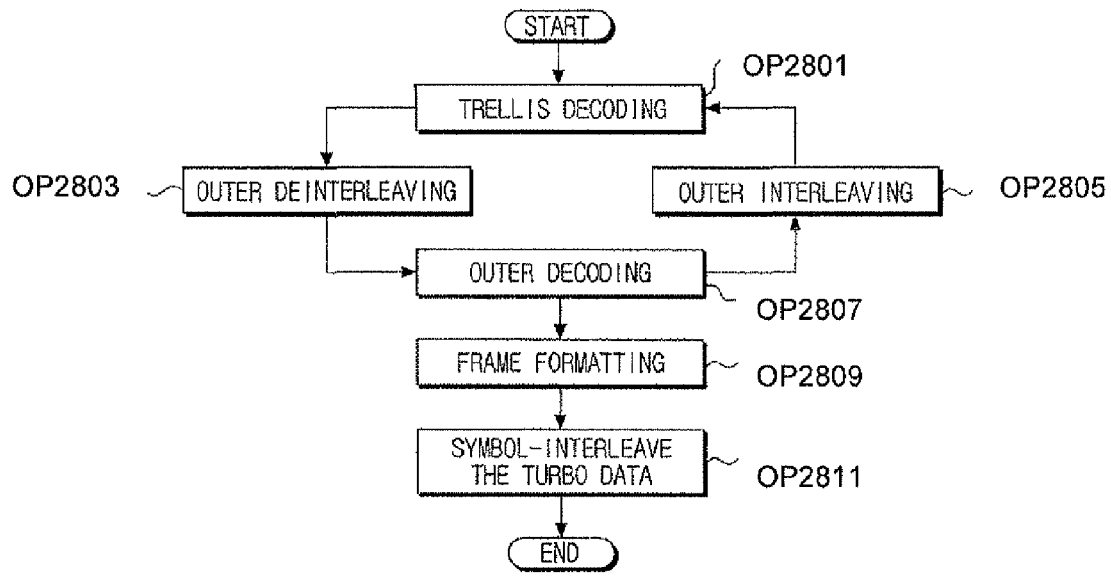
FIG. 36 is a flowchart for outlining a turbo stream decoding method according to one embodiment of the present invention.

FIG. 36 is a flowchart to outline a turbo decoding method according to one embodiment of the present invention. Referring to FIG. 36, the turbo stream of the dual TS is trellis-decoded (op 2801). The trellis-decoded turbo stream is outer-deinterleaved (op 2803) and outer-decoded (op 2807).

When the hard decision output value is output through the outer decoding, the hard decision turbo stream is formatted in accordance with the frame of the dual TS (op 2809) and symbol-interleaved (op 2811).

By contrast, when the soft decision output value is output through the outer decoding, the outer interleaving is performed (op 2805). The outer-interleaved turbo stream passes through the trellis decoding and the outer deinterleaving (op 2801 and op 2803). Therefore, the reliable hard decision turbo stream may be acquired.

Figure 37:
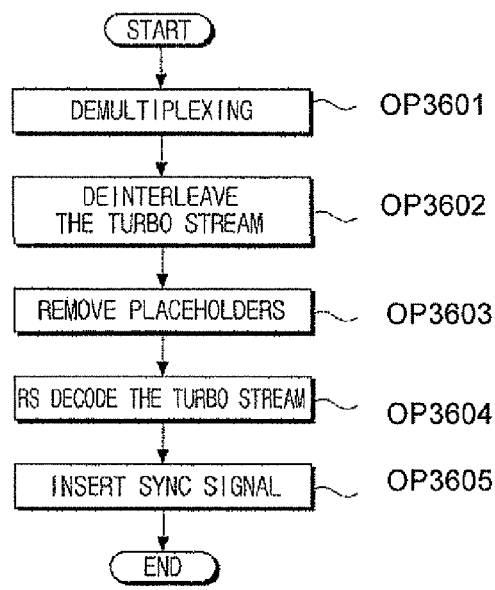
FIG. 37 is a flowchart for outlining a turbo demultiplexing processing method according to one embodiment of the present invention.

FIG. 37 is a flowchart to outline a turbo demultiplexing processing method according to one embodiment of the present invention. Referring to FIG. 37, the turbo steam and the normal stream are separated by demultiplexing the dual TS (op 3601). After deinterleaving the turbo stream (op 3602), empty regions, that is, placeholders are eliminated (op 3603).

Next, the turbo stream is RS-decoded (op 3604), and the turbo stream packet is restored by inserting sync signals (op 3605). As to the demultiplexed normal stream, the normal stream packet is restored by inserting sync signals (op 3605).

Figure 38:
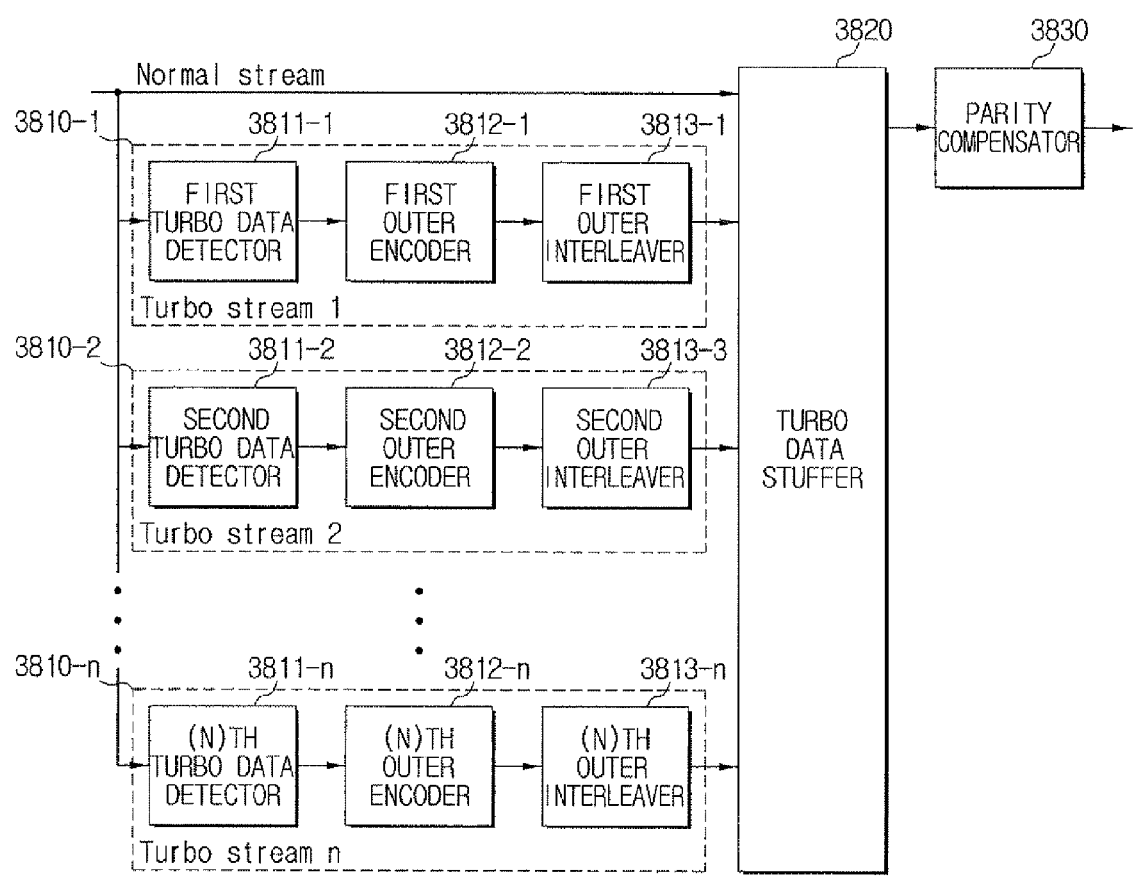
FIGS. 38 and 39 are block diagrams showing the structure of a turbo processor for multi turbo stream transmission according to an exemplary embodiment of the present invention.

FIG. 38 is a block diagram showing the structure of a turbo processor for multi turbo stream transmission according to an exemplary embodiment of the present invention. As shown, the turbo processor includes (n) numbers of turbo processing blocks 3810-1~3810-*n*, a turbo data stuffer 3820, and a parity compensator 3830.

The turbo processing blocks 3810-1~3810-n include first through (n)th turbo data detectors 3811-1~3811-n, first through (n)th outer encoders 3812-1~3812-n, and first through (n)th outer interleavers 3813-1~3813-n, respectively.

The first turbo processing block 3810-1 will be explained as an example. The first turbo data detector 3811-1 of the first turbo processing block 3810-1 detects a turbo stream from the dual transport stream (TS). The detected turbo stream is encoded at the first outer encoder 3812-1, and interleaved at the first outer interleaver 3813-1. Accordingly, after being processed at the turbo processing blocks 3810-1~3810-n in the manner explained above, the turbo streams are stuffed in the dual TS by the turbo stream stuffer 3820.

The parity compensator 3830 compensates for the parity error generated in the turbo stream encoding process. The parity compensator 3830 may be omitted if an RS encoder is additionally provided at the rear end of the turbo processor. Accordingly, parallel encoding is possible with respect to the turbo stream.

Figure 39:
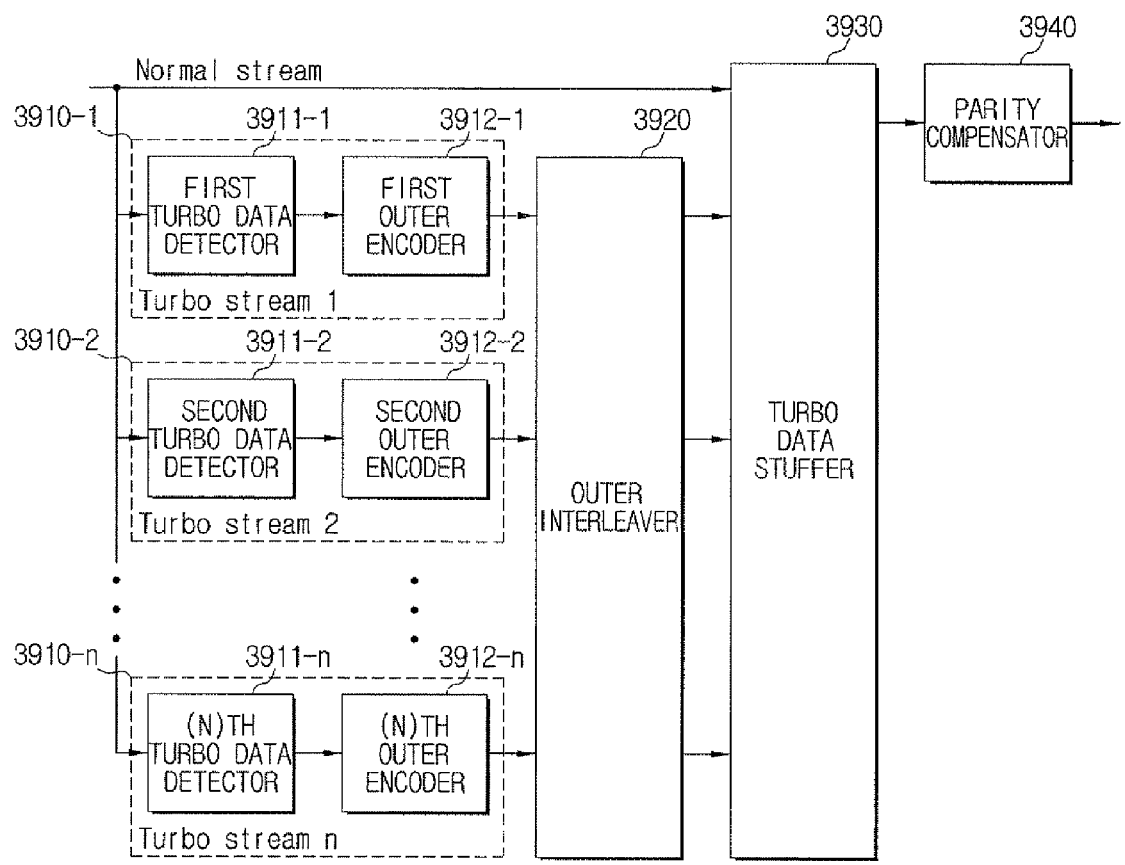

FIG. 39 is a block diagram showing the structure of a turbo processor for multi turbo stream transmission according to another exemplary embodiment of the present invention. As shown in FIG. 39, the turbo processor includes (n) numbers of turbo processing blocks 3910-1~3910-n, an outer interleaver 3920, a turbo data stuffer 3930, and a parity compensator 3940.

The turbo processing blocks 3910-1 includes first through (n)th turbo data detectors 3911-1~3911-n, and first through (n)th outer encoders 3912-1~3912-n.

The first turbo processing block 3910-1 will be explained as an example. The first turbo data detector 3911-1 detects a turbo stream from the dual TS. The detected turbo stream is encoded at the first outer encoder 3912-1 and provided to the outer interleaver 3920.

The outer interleaver 3920 outer-interleaves the turbo streams which are received from the plurality of turbo processing blocks 3910-1~3910-n, and provide the resultant stream to the turbo data stuffer 3930. The turbo stream stuffer 3930 stuffs the turbo data to dual TS, and the parity compensator 3940 compensates for the parity error generated in the turbo stream encoding process.

The turbo decoder of FIGS. 38 and 39 may be applied to the digital broadcasting transmission systems shown in FIGS. 9, 14, 17, 23 and 25. Furthermore, the number of turbo processing blocks may be changed according to the desired number of independent turbo streams. In this case, the limited number of turbo processing blocks may be shared in the time division method in order to reduce hardware complexity.

FIGS. 40 through 42 show the structure of the dual TS being transmitted by the digital broadcasting transmission system having the turbo decoder as shown in FIGS. 38 and 39. As shown, the multi turbo streams are transmitted. Accordingly, the transmission rate of the turbo data is increased, compared to the normal data. The structure of the dual TS as shown in FIGS. 40 through 42 will not be explained, as this has already been explained above.

Figure 43:
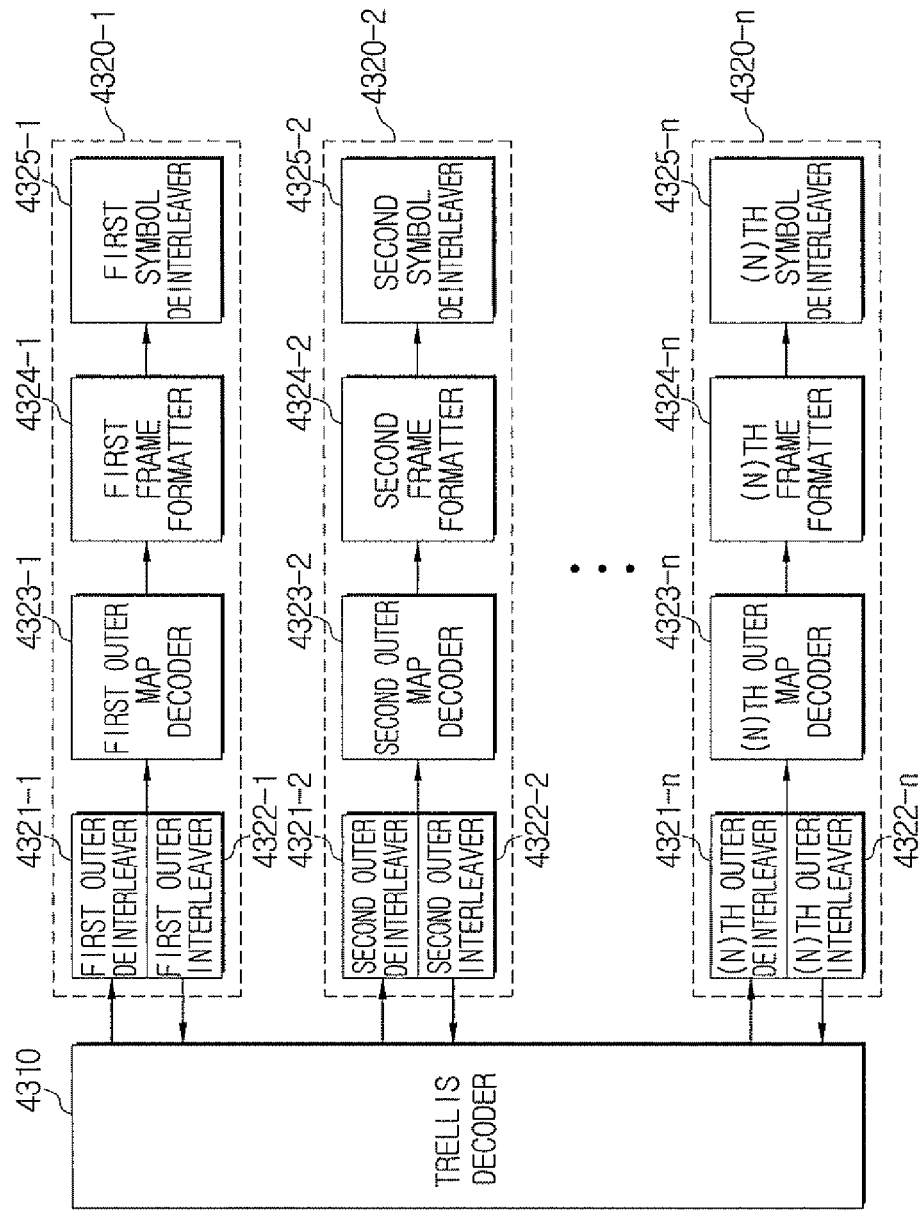
FIGS. 43 and 44 are block diagrams showing the structure of a turbo decoder for multi turbo stream reception according to an exemplary embodiment of the present invention.

FIG. 43 is a block diagram showing the structure of a turbo decoder for a multi turbo stream according to an exemplary embodiment of the present invention. As shown, the turbo decoder includes a trellis-decoder 4310 and a plurality of turbo decode processing blocks 4320-1~4320-n.

The turbo decode processing blocks 4320-1~4320-n comprise outer deinterleavers 4321-1~4321-n, outer interleavers 4322-1~4322-n, outer map decoders 4322-1~4323-n, frame formatters 4324-1~4324-n, and symbol deinterleavers 4325-1~4325-n.

The above components will not be explained as this has been already described above.

Figure 44:
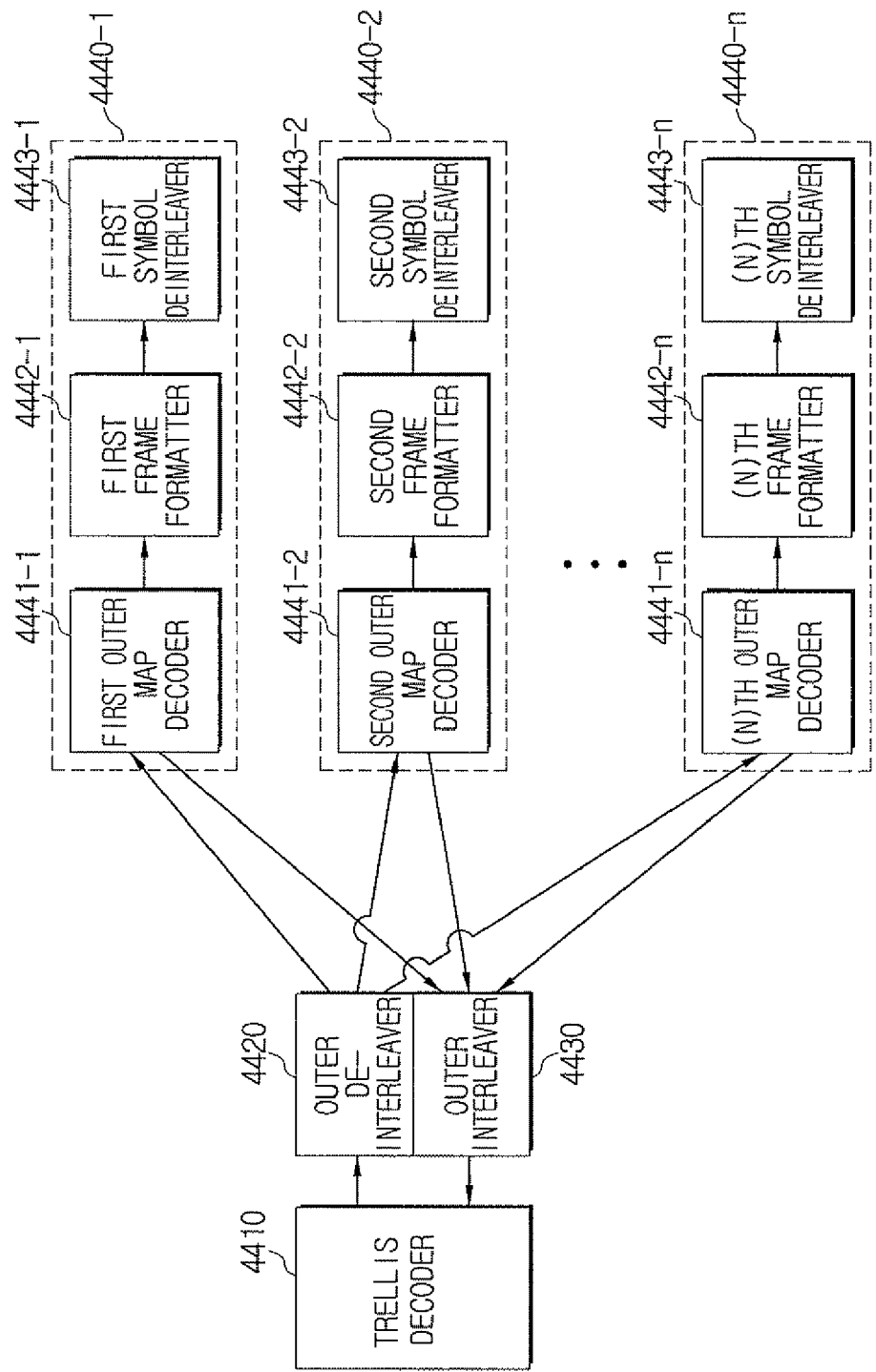

FIG. 44 is a block diagram showing the structure of a turbo decoder for a multi turbo stream according to an exemplary embodiment of the present invention. As shown, the turbo decoder comprises a trellis decoder 4410, an outer deinterleaver 4420, an outer interleaver 4430 and a plurality of turbo decode processing blocks 4440-1~4440-n.

The turbo decode processing blocks 4440-1~4440-n comprise outer map decoders 441-1~4441-n, frame formatters 4442-1~4442-n, and symbol deinterleavers 4443-1~4443-n, respectively. As shown in FIG. 44, the deinterleaved turbo stream of the outer deinterleaver 4420 is decoded at the plurality of turbo decode processing blocks 4440-1~4440-n, interleaved at the outer interleaver 4430 and trellis-decoded at the trellis decoder 4410. The detailed explanation will be omitted for the sake of brevity.

As shown in FIGS. 43 and 44, a plurality of turbo streams are decoded in parallel. Therefore, a high volume of turbo stream packets may be recovered within a short time.

As in the case of turbo processing blocks, the number of turbo decode processing blocks may also be changed according to the desired number of independent turbo streams. In this case, the limited number of turbo processing blocks may be shared in the time division method in order to reduce hardware complexity.

As set forth above, the methods of robustly processing and transmitting the digital broadcasting TS, the digital broadcasting transmission and reception system, and the signal processing methods thereof aim at the reception performance improvement of the ATSC VSB scheme, which is the U.S.A. terrestrial DTV system, through the information exchange and the mapping with respect to the dual TS including the normal stream and the turbo stream. Therefore, the digital broadcasting transmission system of the present invention may have compatibility with the existing normal data transmission system and improve the reception performance in diverse reception environments.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A digital broadcasting reception apparatus which receives a transport stream (TS) including a normal data stream and a plurality of additional data streams, the apparatus comprising:
    a trellis decoder to perform trellis decoding of the plurality of additional data streams;
    an deinterleaver to deinterleave the trellis-decoded additional data streams;
    a decoder to decode the deinterleaved additional data streams;
    an interleaver to interleave the decoded additional data streams; and
    an outer decoder to outer decode the interleaved additional data streams.

2. The digital broadcasting reception apparatus of claim 1, further comprising:
    a frame formatter to perform frame formatting of the additional data streams output by the decoder.

3. The digital broadcasting reception apparatus of claim 1, further comprising:
    a symbol deinterleaver to convert the additional data streams from symbol unit to byte unit.

4. A reception method of a digital broadcasting reception apparatus which receives a transport stream (TS) including a normal data stream and a plurality of additional data streams, the method comprising:

performing trellis decoding of the plurality of additional data streams, the trellis decoding being performed by a trellis decoder;

deinterleaving the trellis-decoded additional data streams;

decoding the deinterleaved additional data streams;

interleaving the decoded additional data streams; and outer decoding the interleaved additional data streams.

5. The reception method of claim 4, further comprising:
performing frame formatting of the decoded additional data streams.

6. The reception method of claim 4, further comprising:
converting the additional data streams from symbol unit to byte unit.

* * * * *